United States Patent
Inokuchi et al.

(10) Patent No.: US 11,404,550 B2
(45) Date of Patent: Aug. 2, 2022

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Tomoaki Inokuchi, Yokohama Kanagawa (JP); Hiro Gangi, Ota Tokyo (JP); Yusuke Kobayashi, Nagareyama Chiba (JP); Kentaro Ikeda, Kawasaki Kanagawa (JP); Tatsunori Sakano, Shinagawa Tokyo (JP); Ryosuke Iijima, Setagaya Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 40 days.

(21) Appl. No.: 17/017,332

(22) Filed: Sep. 10, 2020

(65) Prior Publication Data
US 2021/0175339 A1    Jun. 10, 2021

(30) Foreign Application Priority Data
Dec. 6, 2019 (JP) .............................. JP2019-221369

(51) Int. Cl.
*H01L 29/423* (2006.01)
*H01L 21/18* (2006.01)
(Continued)

(52) U.S. Cl.
CPC ........ *H01L 29/4236* (2013.01); *H01L 21/187* (2013.01); *H01L 29/407* (2013.01); *H01L 29/7827* (2013.01)

(58) Field of Classification Search
None
See application file for complete search history.

(56) References Cited

U.S. PATENT DOCUMENTS 6,475,864 B1    11/2002    Sato et al.
8,723,253 B2    5/2014    Ohta et al.
(Continued)

FOREIGN PATENT DOCUMENTS

JP    2002-83962 A    3/2002
JP    2014-225693 A    12/2014
(Continued)

OTHER PUBLICATIONS

Kariyazaki et al., "Malecuar simulation on interfacial structure and lettering efficiency of direct silicon bonded (110) / (100) substrates," Journal of Applied Physics 107:113509-1 to -6 (2010).

*Primary Examiner* — Hsien Ming Lee
(74) *Attorney, Agent, or Firm* — Finnegan, Henderson, Farabow, Garrett & Dunner L.L.P.

(57) ABSTRACT

According to one embodiment, a semiconductor device includes first, and second conductive members, first, second, and third semiconductor regions, and an insulating part. A direction from the first conductive member toward the second conductive member is along a first direction. The first semiconductor region includes first and second partial regions. A second direction from the first partial region toward the second partial region crosses the first direction. The first conductive member is between the first partial region and the second conductive member. A direction from the second partial region toward the second semiconductor region is along the first direction. A direction from the second conductive member toward the second semiconductor region is along the second direction. The third semiconductor region is between the second partial region and the second semiconductor region. The insulating part includes a first insulating region, a second insulating region, and a third insulating region.

18 Claims, 15 Drawing Sheets

(51) Int. Cl.
*H01L 29/78* (2006.01)
*H01L 29/40* (2006.01)

(56) References Cited

U.S. PATENT DOCUMENTS

| | | | |
|---|---|---|---|
| 9,525,059 | B1 | 12/2016 | Kobayashi |
| 10,192,962 | B2 | 1/2019 | Osawa |
| 2012/0061753 | A1* | 3/2012 | Nishiwaki ............. H01L 29/407 |
| | | | 257/331 |
| 2021/0057575 | A1* | 2/2021 | Nishiwaki ............. H01L 29/407 |

FOREIGN PATENT DOCUMENTS

| JP | 2017-55016 A | 3/2017 |
|---|---|---|
| JP | 2017-188590 A | 10/2017 |

\* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2019-221369, filed on Dec. 6, 2019; the entire contents of which are incorporated herein by reference.

FIELD

Embodiments of the invention generally relate to a semiconductor device and a method for manufacturing the semiconductor device.

BACKGROUND

It is desirable to improve the characteristics of a semiconductor device.

DETAILED DESCRIPTION

Figure 1:
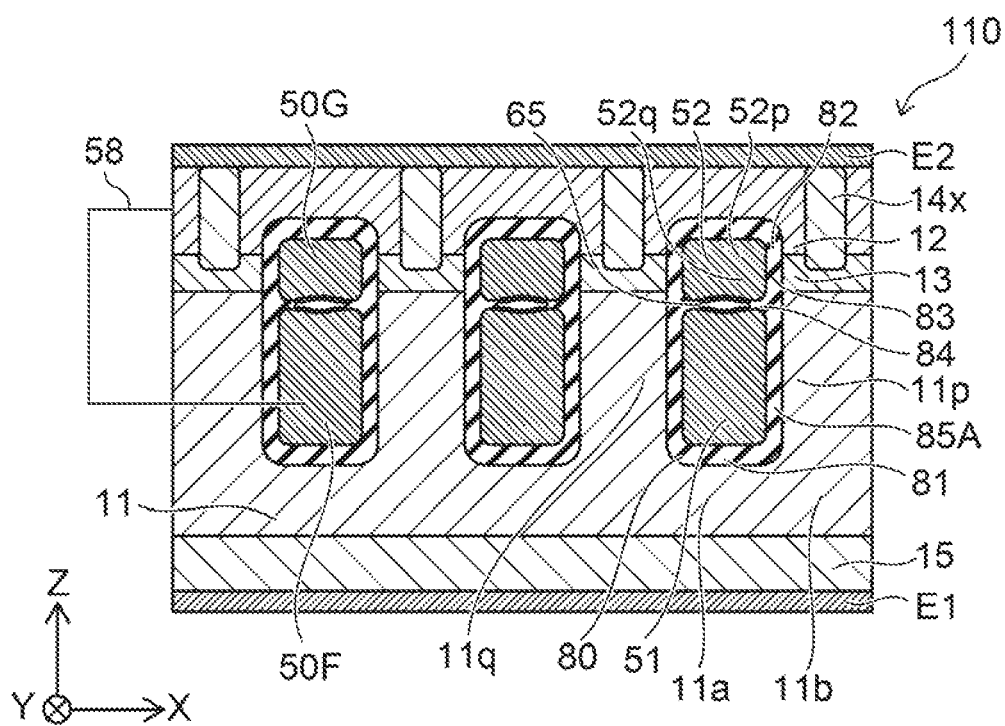
FIG. 1 is a schematic cross-sectional view illustrating a semiconductor device according to a first embodiment.

According to one embodiment, a semiconductor device includes a first conductive member, a second conductive member, a first semiconductor region, a second semiconductor region, a third semiconductor region, and an insulating part. A direction from the first conductive member toward the second conductive member is along a first direction. The first semiconductor region is of a first conductivity type. The first semiconductor region includes a first partial region and a second partial region. A second direction from the first partial region toward the second partial region crosses the first direction. The first conductive member is between the first partial region and the second conductive member in the first direction. The second semiconductor region is of the first conductivity type. A direction from the second partial region toward the second semiconductor region is along the first direction. A direction from a portion of the second conductive member toward the second semiconductor region is along the second direction. The third semiconductor region is of a second conductivity type. The third semiconductor region is between the second partial region and the second semiconductor region in the first direction. A direction from an other portion of the second conductive member toward the third semiconductor region is along the second direction. The insulating part includes a first insulating region provided between the first partial region and the first conductive member in the first direction, a second insulating region provided between the second semiconductor region and the portion of the second conductive member in the second direction, and a third insulating region provided between the third semiconductor region and the other portion of the second conductive member in the second direction. A void is between the first conductive member and the second conductive member.

According to one embodiment, a semiconductor device includes a first conductive member, a second conductive member, a first semiconductor region, a second semiconductor region, a third semiconductor region, and an insulating part. A direction from the first conductive member toward the second conductive member is along a first direction. The first semiconductor region is of a first conductivity type. The first semiconductor region includes a first partial region and a second partial region. A second direction from the first partial region toward the second partial region crosses the first direction. The first conductive member is between the first partial region and the second conductive member in the first direction. The second semiconductor region is of the first conductivity type. A direction from the second partial region toward the second semiconductor region is along the first direction. A direction from a portion of the second conductive member toward the second semiconductor region is along the second direction. The third semiconductor region is of a second conductivity type. The third semiconductor region is provided between the second partial region and the second semiconductor region in the first direction. A direction from an other portion of the second conductive member toward the third semiconductor region is along the second direction. The insulating part includes a first insulating region provided between the first partial region and the first conductive member in the first direction, a second insulating region provided between the second semiconductor region and the portion of the second conductive member in the second direction, and a third insulating region provided between the third semiconductor region and the other portion of the second conductive member in the second direction. The first conductive member includes a first surface facing the second conductive member. The first surface is concave.

According to one embodiment, a semiconductor device includes a first conductive member, a second conductive member, a first semiconductor region, a second semiconductor, a third semiconductor region, and an insulating part. A direction from the first conductive member toward the second conductive member is along a first direction. The first semiconductor region is of a first conductivity type. The first semiconductor region includes a first partial region, a second partial region, a third partial region, a fourth partial region, and a fifth partial region. A second direction from the third partial region toward the second partial region crosses the first direction. The first partial region is between the third partial region and the second partial region in the second direction. The first conductive member is between the first partial region and the second conductive member in the first direction. The first conductive member is between the fourth partial region and the fifth partial region in the second direction. The second semiconductor region is of the first conductivity type. The second semiconductor region includes a first semiconductor portion and a second semiconductor portion. A direction from the second semiconductor portion toward the first semiconductor portion is along the second direction. The fourth partial region is between the third partial region and the first semiconductor portion in the first direction. The fifth partial region is between the second partial region and the second semiconductor portion in the first direction. A portion of the second conductive member is between the first semiconductor portion and the second semiconductor portion. The third semiconductor region is of a second conductivity type. The third semiconductor region includes a third semiconductor portion and a fourth semiconductor portion. The third semiconductor portion is between the fourth partial region and the first semiconductor portion in the first direction. The fourth semiconductor portion is between the fifth partial region and the second semiconductor portion in the first direction. An other portion of the second conductive member is between the third semiconductor portion and the fourth semiconductor portion in the second direction. The insulating part includes a first insulating region provided between the first partial region and the first conductive member in the first direction, a second insulating region provided between the third semiconductor portion and the other portion of the second conductive member in the second direction, a third insulating region provided between the fourth semiconductor portion and the other portion of the second conductive member in the second direction, a fourth insulating region provided between the fourth partial region and the first conductive member in the second direction, and a fifth insulating region provided between the first conductive member and the fifth partial region in the second direction. The fourth insulating region includes a first side surface facing the fourth partial region. The fifth insulating region includes a second side surface facing the fifth partial region. The second insulating region includes a third side surface facing the third semiconductor portion. The third insulating region includes a fourth side surface facing the fourth semiconductor portion. A first distance along the second direction between the first side surface and the second side surface is greater than a second distance along the second direction between the third side surface and the fourth side surface.

According to one embodiment, a semiconductor device includes a first conductive member, a second conductive member, a third conductive member, a fourth conductive member, a fifth conductive member, a first semiconductor region, a second semiconductor region, a third semiconductor region, and an insulating part. A direction from the first conductive member toward the second conductive member is along a first direction. A second direction from the first conductive member toward the third conductive member crosses the first direction. A direction from the third conductive member toward the fourth conductive member is along the first direction. A direction from the second conductive member toward the fourth conductive member is along the second direction. The fifth conductive member is provided between the second conductive member and the fourth conductive member in the second direction. The first semiconductor region is of a first conductivity type. The first semiconductor region includes a first partial region, a second partial region, a third partial region, and a fourth partial region. The third partial region is between the first partial region and the second partial region in the second direction. A direction from the first partial region toward the second conductive member is along the first direction. A direction from the second partial region toward the fourth conductive member is along the first direction. A direction from the third partial region toward the fifth conductive member is along the first direction. The fourth partial region is between the third partial region and the fifth conductive member in the first direction. The fourth partial region is between the first conductive member and the third conductive member in the second direction. The second semiconductor region is of the first conductivity type. The second semiconductor region includes a first semiconductor portion and a second semiconductor portion. At least a portion of the first semiconductor portion is between the second conductive member and the fifth conductive member in the second direction. At least a portion of the second semiconductor portion is between the fifth conductive member and the fourth conductive member in the second direction. The third semiconductor region is of a second conductivity type. The third semiconductor region includes a third semiconductor portion and a fourth semiconductor portion. The third semiconductor portion is between the first semiconductor region and the first semiconductor portion in the first direction. The fourth semiconductor portion is between the first semiconductor region and the second semiconductor portion in the first direction. The third semiconductor portion is between the second conductive member and the fifth conductive member in the second direction. The fourth semiconductor portion is between the fifth conductive member and the fourth conductive member in the second direction. The insulating part includes a first insulating region provided between the first partial region and the first conductive member in the first direction, a second insulating region provided between the second partial region and the third conductive member in the first direction, a third insulating region provided between the fourth partial region and the fifth conductive member in the first direction, a fourth insulating region provided between the first conductive member and the fourth partial region in the second direction, and a fifth insulating region provided between the fourth partial region and the third conductive member in the second direction. The fourth partial region contacts the third insulating region, the fourth insulating region, and the fifth insulating region.

According to one embodiment, a semiconductor device includes a first conductive member, a second conductive member, a third conductive member, a first semiconductor region, a second semiconductor region, a third semiconductor region, a fourth semiconductor region, and an insulating part. A direction from the first conductive member toward the second conductive member is along a first direction. The third conductive member includes a first conductive portion and a second conductive portion. The first conductive portion is provided between the first conductive member and the second conductive member. The first semiconductor region is of a first conductivity type. The first semiconductor region includes a first partial region, a second partial region, a third partial region, and a fourth partial region. A second direction from the first partial region toward the second partial region crosses the first direction. The first conductive member is between the first partial region and the second conductive member in the first direction. The second semiconductor region is of the first conductivity type. A direction from the second partial region toward the second semiconductor region is along the first direction. A direction from a portion of the second conductive member toward the second semiconductor region is along the second direction. The third partial region is between the second partial region and the second semiconductor region in the first direction. The second conductive portion is between the third partial region and the second semiconductor region in the first direction. The third semiconductor region is of a second conductivity type. The third semiconductor region is provided between the second conductive portion and the second semiconductor region in the first direction. A direction from an other portion of the second conductive member toward the third semiconductor region is along the second direction. The fourth semiconductor region is of the first conductivity type. The fourth semiconductor region is between the second conductive portion and the third semiconductor region in the first direction. The insulating part includes a first insulating region provided between the first conductive member and the first conductive portion, and a second insulating region provided between the first conductive portion and the second conductive member.

According to one embodiment, a semiconductor device includes a first conductive member, a second conductive member, a first semiconductor region, a second semiconductor region, a third semiconductor region, and an insulating part. A direction from the first conductive member toward the second conductive member is along a first direction. The first semiconductor region is of a first conductivity type. The first semiconductor region includes a first partial region and a second partial region. A second direction from the first partial region toward the second partial region crosses the first direction. The first conductive member is between the first partial region and the second conductive member in the first direction. The second semiconductor region is of the first conductivity type. A direction from the second partial region toward the second semiconductor region is along the first direction. A direction from a portion of the second conductive member toward the second semiconductor region is along the second direction. The third semiconductor region is of a second conductivity type. The third semiconductor region is between the second partial region and the second semiconductor region in the first direction. A direction from an other portion of the second conductive member toward the third semiconductor region is along the second direction. The insulating part includes a first insulating region provided between the first partial region and the first conductive member in the first direction, a second insulating region provided between the second semiconductor region and the portion of the second conductive member in the second direction, and a third insulating region provided between the third semiconductor region and the other portion of the second conductive member in the second direction. A crystal orientation of the first conductive member is different from a crystal orientation of the second conductive member.

According to one embodiment, a method for manufacturing a semiconductor device is disclosed. The method can include preparing a first structure body. The first structure body includes a first semiconductor layer of a first conductivity type, a first conductive member, and a first insulating part provided between the first semiconductor layer and the first conductive member. The method can include bonding a semiconductor member to the first structure body, and forming a second semiconductor layer of the first conductivity type, a third semiconductor layer of a second conductivity type, a second conductive member, and a second insulating part. At least the second semiconductor layer and the third semiconductor layer are formed from the semiconductor member. The third semiconductor layer is between the second semiconductor layer and the first structure body. The second insulating part is between the second semiconductor layer and the second conductive member and between the third semiconductor layer and the second conductive member.

According to one embodiment, a method for manufacturing a semiconductor device is disclosed. The method can include preparing a first structure body. The first structure body includes a first semiconductor layer of a first conductivity type, a plurality of first conductive members, and a first insulating part provided between the first semiconductor layer and the plurality of first conductive members. The first semiconductor layer includes a region between the plurality of first conductive members. The method can include forming a semiconductor member on the region between the plurality of first conductive members, and forming a second semiconductor layer of the first conductivity type, a third semiconductor layer of a second conductivity type, a second conductive member, and a second insulating part. At least the second semiconductor layer and the third semiconductor layer are formed from the semiconductor member. The third semiconductor layer is between the second semiconductor layer and the first structure body. The second insulating part is between the second semiconductor layer and the second conductive member and between the third semiconductor layer and the second conductive member.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with the same reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the first embodiment includes a first conductive member 51, a second conductive member 52, a first semiconductor region 11, a second semiconductor region 12, a third semiconductor region 13, and an insulating part 80.

The direction from the first conductive member 51 toward the second conductive member 52 is along a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

For example, the first conductive member 51 and the second conductive member 52 have band configurations extending along the Y-axis direction.

The first semiconductor region 11 is of a first conductivity type. In one example, the first conductivity type is an n-type, and a second conductivity type that is described below is a p-type. In the embodiment, the first conductivity type may be the p-type, and the second conductivity type may be the n-type. Hereinbelow, the first conductivity type is taken to be the n-type, and the second conductivity type is taken to be the p-type.

The first semiconductor region 11 includes a first partial region 11a and a second partial region 11b. A second direction from the first partial region 11a toward the second partial region 11b crosses the first direction (the Z-axis direction). The second direction is, for example, the X-axis direction.

The first conductive member 51 is between the first partial region 11a and the second conductive member 52 in the first direction.

The second semiconductor region 12 is of the first conductivity type (e.g., the n-type). The direction from the second partial region 11b toward the second semiconductor region 12 is along the first direction (the Z-axis direction). The direction from a portion 52p of the second conductive member 52 toward the second semiconductor region 12 is along the second direction (the X-axis direction).

The third semiconductor region 13 is of the second conductivity type (e.g., the p-type). The third semiconductor region 13 is between the second partial region 11b and the second semiconductor region 12 in the first direction (the Z-axis direction). The direction from another portion 52q of the second conductive member 52 toward the third semiconductor region 13 is along the second direction (the X-axis direction).

The insulating part 80 includes a first insulating region 81, a second insulating region 82, and a third insulating region 83. The first insulating region 81 is provided between the first partial region 11a and the first conductive member 51 in the first direction (the Z-axis direction). The second insulating region 82 is provided between the second semiconductor region 12 and the portion 52p of the second conductive member 52 described above in the second direction (e.g., the X-axis direction). The third insulating region 83 is provided between the third semiconductor region 13 and the other portion 52q of the second conductive member 52 described above in the second direction.

The first insulating region 81, the second insulating region 82, and the third insulating region 83 may be continuous with each other. The insulating part 80 electrically insulates the first conductive member 51 and the first semiconductor region 11 from each other. The insulating part 80 electrically insulates the second conductive member 52 and the second semiconductor region 12 from each other. The insulating part 80 electrically insulates the second conductive member 52 and the third semiconductor region 13 from each other.

In the example, the semiconductor device 110 includes a first electrode E1 and a second electrode E2. The first partial region 11a is between the first electrode E1 and the first conductive member 51 in the first direction (the Z-axis direction). The first electrode E1 is electrically connected to the first semiconductor region 11. The second electrode E2 is electrically connected to the second semiconductor region 12.

In the example, the semiconductor device 110 further includes a conductive region 14x. The conductive region 14x may be, for example, a semiconductor region of the second conductivity type. For example, at least a portion of the second semiconductor region 12 is between the conductive region 14x and the portion 52p of the second conductive member 52 in the second direction (the X-axis direction). When the conductive region 14x is a semiconductor region, the concentration of the second-conductivity-type impurity in the conductive region 14x is greater than the concentration of the second-conductivity-type impurity in the third semiconductor region 13. For example, the third semiconductor region 13 is a p⁻-region. For example, the conductive region 14x is a p⁺-region. In the example, the conductive region 14x contacts the third semiconductor region 13. The conductive region 14x may include a metal.

In the example, the insulating part 80 further includes a fourth insulating region 84. The fourth insulating region 84 is provided between at least a portion of the first conductive member 51 and at least a portion of the second conductive member 52 in the first direction (the Z-axis direction). For example, the fourth insulating region 84 insulates the first and second conductive members 51 and 52 from each other.

The first semiconductor region 11 includes a partial region 11p and a partial region 11q. The partial region 11p is between the second partial region 11b and the third semiconductor region 13 in the first direction (the Z-axis direction). The direction from the first conductive member 51 toward the partial region 11p is along the second direction (the X-axis direction). The first conductive member 51 is between the partial region 11q and the partial region 11p in the second direction.

The insulating part 80 further includes a fifth insulating region 85A. The fifth insulating region 85A is provided between the partial region 11q and the first conductive member 51 in the second direction (the X-axis direction) and between the first conductive member 51 and the partial region 11p.

In the example, the semiconductor device 110 further includes a fifth semiconductor region 15 of the first conductivity type. At least a portion of the fifth semiconductor region 15 is between the first electrode E1 and the first semiconductor region 11 in the first direction (the Z-axis direction). The concentration of the first-conductivity-type impurity in the fifth semiconductor region 15 is greater than the concentration of the first-conductivity-type impurity in the first semiconductor region 11. For example, the first semiconductor region 11 is an n⁻-region. The fifth semiconductor region 15 is an n⁺-region. For example, the third semiconductor region 13 is an n⁻-region.

For example, the first electrode E1 functions as a drain electrode. For example, the second electrode E2 functions as a source electrode. For example, the second conductive member 52 functions as a gate electrode. For example, a current that flows between the first electrode E1 and the second electrode E2 can be controlled by controlling the potential of the second conductive member 52 (e.g., the potential referenced to the potential of the second electrode E2). The semiconductor device 110 is, for example, a vertical transistor. For example, the first semiconductor region 11 functions as a drift layer.

For example, the first conductive member 51 is electrically connected to the second electrode E2. For example, the first conductive member 51 and the second electrode E2 are electrically connected to each other by an interconnect 58, etc. For example, the electric field distribution in the drift layer can be changed by the first conductive member 51. Thereby, for example, the breakdown voltage can be increased while maintaining a high impurity concentration of the drift layer and obtaining a low on-resistance. For example, the first conductive member 51 functions as a field plate.

For example, multiple gate electrodes 50G and multiple field plates 50F are provided in the semiconductor device 110. The first conductive member 51 is, for example, one of the multiple field plates 50F. The second conductive member 52 is, for example, one of the multiple gate electrodes 50G.

In one example of the semiconductor device 110, the semiconductor regions (e.g., the first to third semiconductor regions 11 to 13, and the fifth semiconductor region 15, etc.) include at least one selected from the group consisting of silicon, carbon, and germanium, etc. The semiconductor regions may include a compound semiconductor. The compound semiconductor includes, for example, at least one selected from the group consisting of tin, aluminum, gallium, indium, nitrogen, phosphorus, arsenic, zinc-antimony, oxygen, sulfur, selenium, tellurium, and magnesium. The semiconductor regions may include, for example, at least one selected from the group consisting of GaN, $GaO_x$, GaAs, InGaAs, InP, AlN, AlGaN, ZnO, MgZnO, $InGaZnO_x$, and GaSb. The conductive region 14x may include a semiconductor. In one example of the semiconductor device 110, the conductive members (the first and second conductive members 51 and 52, etc.) include polysilicon, a metal, etc. In one example of the semiconductor device 110, the insulating part 80 includes, for example, at least one selected from the group consisting of silicon oxide, silicon nitride, silicon oxynitride, aluminum oxide, and hafnium oxide.

In the semiconductor device 110 as shown in FIG. 1, a void 65 is between the first conductive member 51 and the second conductive member 52. For example, the void 65 is in a reduced-pressure state. The void 65 may include, for example, an inert gas (e.g., a nitrogen gas, a noble gas, etc.). The relative dielectric constant of the void 65 is less than the relative dielectric constant of the insulating part 80.

Because the void 65 is provided in the semiconductor device 110, the capacitance that forms between the first conductive member 51 and the second conductive member 52 can be reduced. For example, the time constant of the second conductive member 52 can be reduced. According to the embodiment, good switching characteristics are obtained. According to the embodiment, a semiconductor device can be provided in which the characteristics can be improved.

Figure 2:
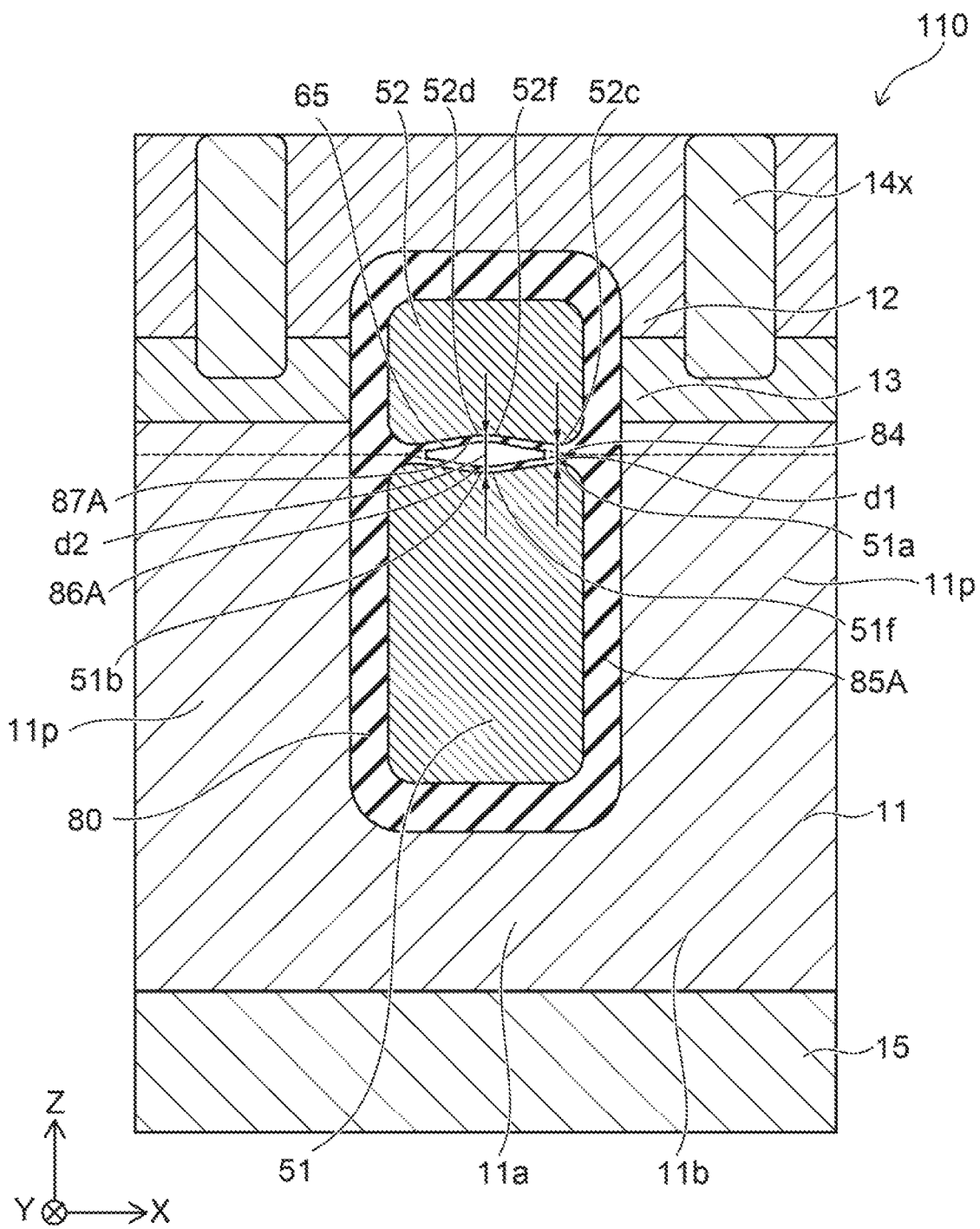
FIG. 2 is a schematic cross-sectional view illustrating the semiconductor device according to the first embodiment.

FIG. 2 is a schematic cross-sectional view illustrating the semiconductor device according to the first embodiment.

FIG. 2 is an enlarged view of a portion of FIG. 1. The first electrode E1 and the second electrode E2 are not illustrated in FIG. 2.

As shown in FIG. 2, the first conductive member 51 includes a first surface 51f facing the second conductive member 52. The second conductive member 52 includes a second surface 52f facing the first conductive member 51.

In the embodiment, at least one of the first surface 51f or the second surface 52f is concave. Thereby, the void 65 is formed between the first surface 51f and the second surface 52f.

For example, the first surface 51f is concave. For example, the first surface 51f is concave in the orientation from the second conductive member 52 toward the first conductive member 51. For example, the inner portion (e.g., the central portion) of the first surface 51f is recessed in the orientation from the second conductive member 52 toward the first conductive member 51 when referenced to the other portions. For example, the second surface 52f is concave in the orientation from the first conductive member 51 toward the second conductive member 52. For example, the inner portion (e.g., the central portion) of the second surface 52f is recessed in the orientation from the first conductive member 51 toward the second conductive member 52 when referenced to the other portions.

For example, the first surface 51f includes a first surface portion 51a and a second surface portion 51b. The distance along the second direction (the X-axis direction) between the first surface portion 51a and the partial region 11p is less than the distance along the second direction (the X-axis direction) between the second surface portion 51b and the partial region 11p. The first surface portion 51a is proximate to the outer edge of the first surface 51f. The second surface portion 51b is distant to the outer edge of the first surface 51f. For example, the second surface portion 51b includes the central portion of the first surface 51f.

For example, the second surface 52f includes a third surface portion 52c and a fourth surface portion 52d. The distance along the second direction (the X-axis direction) between the third surface portion 52c and the partial region 11p is less than the distance along the second direction (the X-axis direction) between the fourth surface portion 52d and the partial region 11p. The third surface portion 52c is proximate to the outer edge of the second surface 52f. The fourth surface portion 52d is distant to the outer edge of the second surface 52f. For example, the fourth surface portion 52d includes the central portion of the second surface 52f.

As shown in FIG. 2, the distance along the first direction (the Z-axis direction) between the first surface portion 51a and the third surface portion 52c is taken as a distance d1. The distance along the first direction (the Z-axis direction) between the second surface portion 51b and the fourth surface portion 52d is taken as a distance d2. The distance d2 is greater than the distance d1.

For example, the void 65 is provided between the second surface portion 51b and the fourth surface portion 52d.

In the embodiment, the insulating part 80 may include a sixth insulating region 86A. The sixth insulating region 86A is between the first surface 51f and the second conductive member 52. For example, the sixth insulating region 86A may be formed by oxidizing the material used to form the first conductive member 51.

In the embodiment, the insulating part 80 may include a seventh insulating region 87A. The seventh insulating region 87A is between the second surface 52f and the first conductive member 51. For example, the seventh insulating region 87A may be formed by oxidizing the material used to form the second conductive member 52.

For example, the void 65 is provided between the sixth insulating region 86A and the seventh insulating region 87A.

In the embodiment, one of the first surface 51f or the second surface 52f may be substantially a plane. For example, the void 65 can be formed when the first surface 51f is a plane and the second surface 52f is a concave surface. For example, the void 65 can be formed when the first surface 51f is a concave surface and the second surface 52f is a plane. For example, the void 65 can be formed when the first surface 51f is a concave surface and the second surface 52f is a concave surface. The curvature of the first surface 51f may be different from the curvature of the second surface 52f.

An example of a method for manufacturing the semiconductor device 110 will now be described.

FIGS. 3A, 3B, 4A, and 4B are schematic cross-sectional views illustrating the method for manufacturing the semiconductor device according to the first embodiment.

Figure 3A:
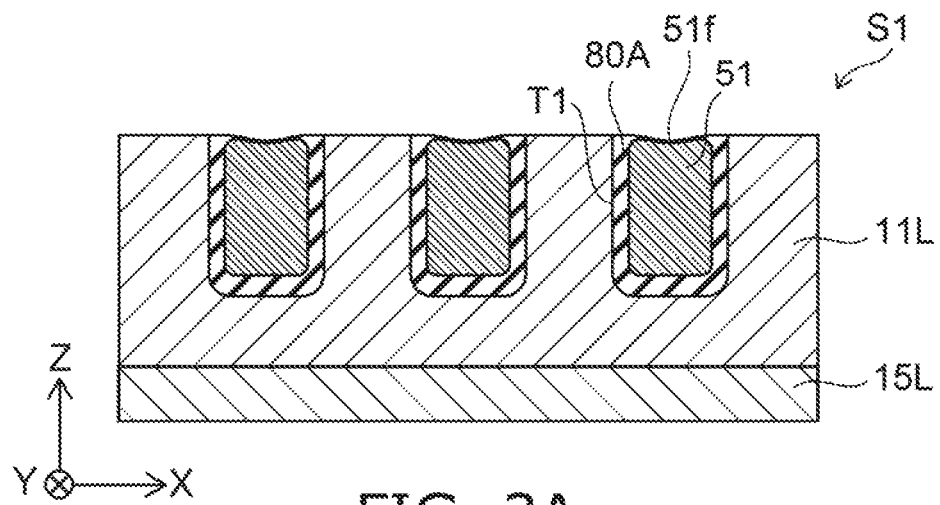
FIGS. 3A and 3B are schematic cross-sectional views illustrating a method for manufacturing the semiconductor device according to the first embodiment.

A first structure body S1 is prepared as shown in FIG. 3A. The first structure body S1 includes a first semiconductor layer 11L of the first conductivity type, the first conductive member 51, and a first insulating part 80A provided between the first semiconductor layer 11L and the first conductive member 51. The first semiconductor layer 11L is used to form at least a portion of the first semiconductor region 11. In the example, the first structure body S1 includes a fifth semiconductor layer 15L. The fifth semiconductor layer 15L is used to form the fifth semiconductor region 15.

In the example, the first surface 51f of the first conductive member 51 is concave. For example, the central portion of the first surface 51f can be recessed more than the outer edge portion of the first surface 51f by processing the surface of the stacked body used to form the first structure body S1. Thereby, the first surface 51f is made concave. The processing of the surface includes, for example, CMP (chemical mechanical polishing), etc.

Figure 3B:
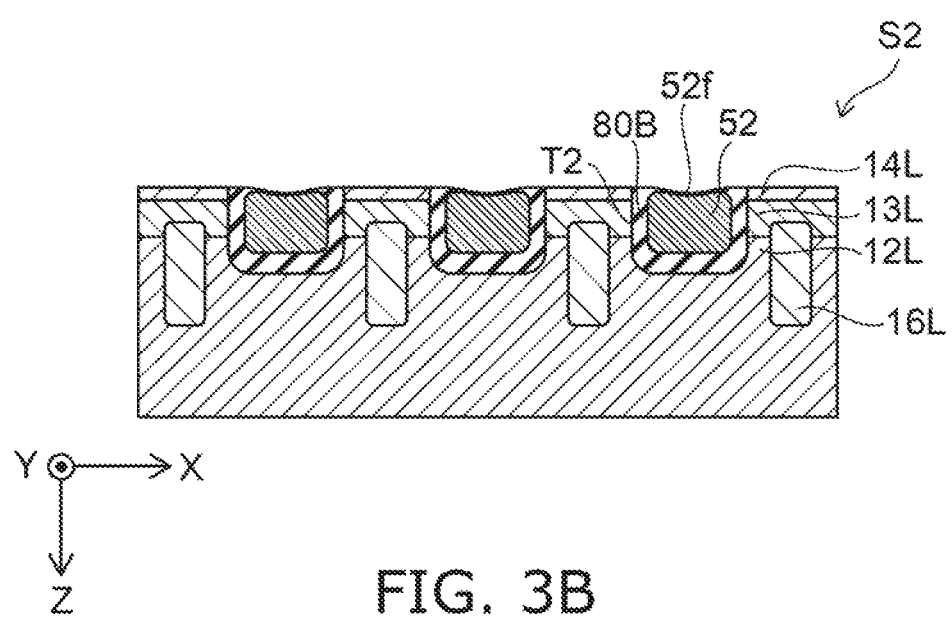

A second structure body S2 is prepared as shown in FIG. 3B. In the example, the second structure body S2 includes a second semiconductor layer 12L of the first conductivity type, a third semiconductor layer 13L of the second conductivity type, a fourth semiconductor layer 14L of the first conductivity type, the second conductive member 52, and a second insulating part 80B. The third semiconductor layer 13L is between the second semiconductor layer 12L and the fourth semiconductor layer 14L. The second insulating part 80B is between the second semiconductor layer 12L and the second conductive member 52, between the third semiconductor layer 13L and the second conductive member 52, and between the fourth semiconductor layer 14L and the second conductive member 52. The second semiconductor layer 12L is used to form at least a portion of the second semiconductor region 12. The third semiconductor layer 13L is used to form at least a portion of the third semiconductor region 13. The fourth semiconductor layer 14L is used to form a portion of the first semiconductor region 11. In the example, the second structure body S2 further includes a conductive layer 16L. The conductive layer 16L may be a metal layer. At least a portion of the conductive layer 16L is used to form the conductive region 14x.

In the example, the second surface 52f of the second conductive member 52 is concave. For example, the central portion of the second surface 52f can be recessed more than the outer edge portion of the second surface 52f by processing the surface of the stacked body used to form the second structure body S2 by CMP, etc. Thereby, the second surface 52f is made concave. The processing of the surface includes, for example, CMP, etc.

Figure 4A:
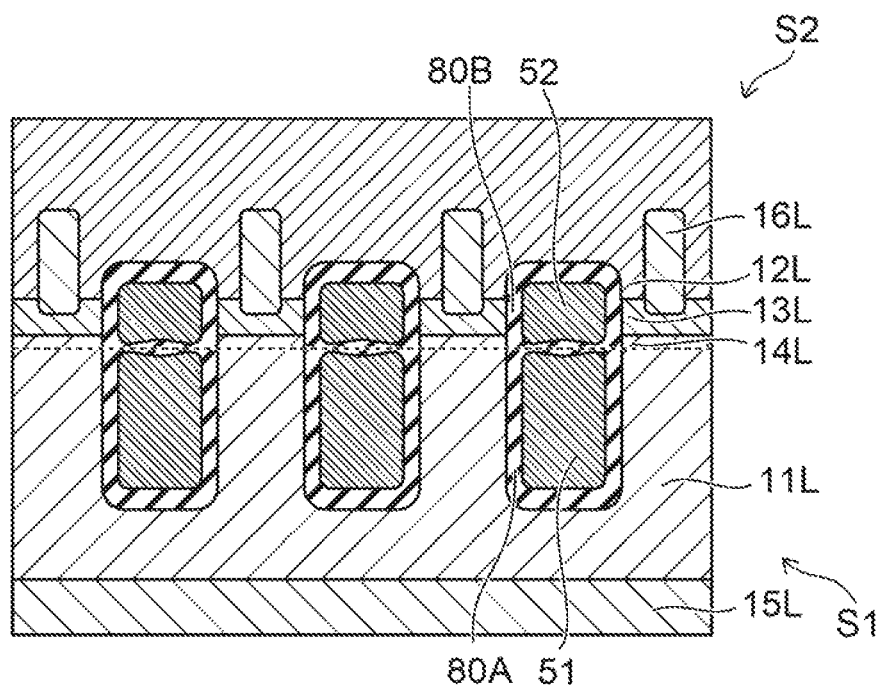
FIGS. 4A and 4B are schematic cross-sectional views illustrating a method for manufacturing the semiconductor device according to the first embodiment.

As shown in FIG. 4A, the first surface 51f and the second surface 52f are caused to face each other. Then, the first semiconductor layer 11L and the fourth semiconductor layer 14L are bonded. The boundary between the first semiconductor layer 11L and the fourth semiconductor layer 14L may be distinct or indistinct.

For example, the void 65 (referring to FIGS. 1 and 2) is formed between the first surface 51f of the first conductive member 51 and the second surface 52f of the second conductive member 52 by bonding the first structure body S1 and the second structure body S2.

Figure 4B:
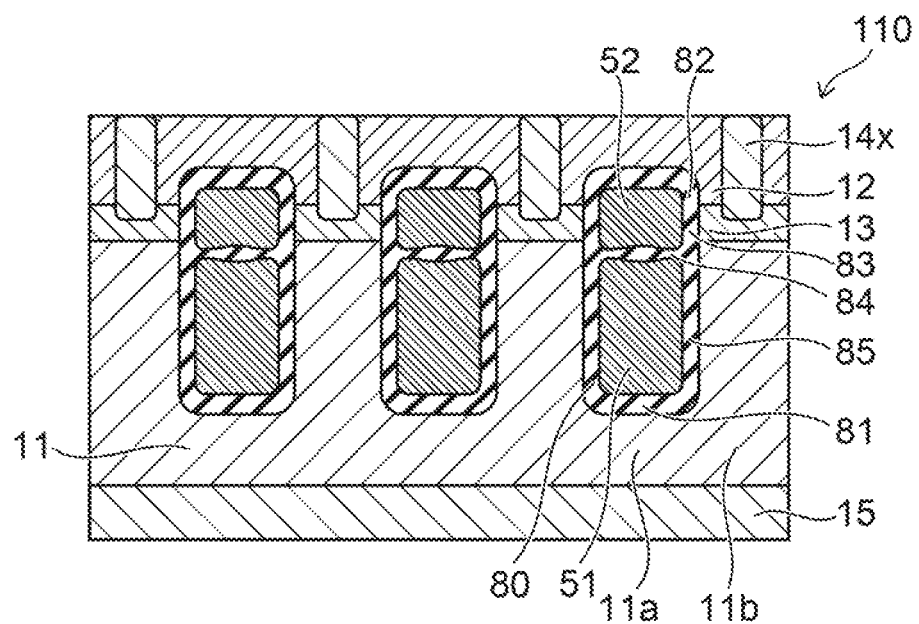

As shown in FIG. 4B, the conductive layer 16L is exposed by removing a portion of the second semiconductor layer 12L. The semiconductor device 110 is obtained thereby. The first semiconductor region 11 is formed from the first and fourth semiconductor layers 11L and 14L. The second semiconductor region 12 is formed from the second semiconductor layer 12L.

The third semiconductor region 13 is formed from the third semiconductor layer 13L. The conductive region 14x is formed from the conductive layer 16L.

The capacitance that forms between the first conductive member 51 and the second conductive member 52 can be reduced by forming the void 65. Good switching characteristics are obtained.

As shown in FIG. 3A, the first structure body S1 includes a first trench T1 in which the first conductive member 51 is formed. As shown in FIG. 3B, the second structure body S2 includes a second trench T2 in which the second conductive member 52 is formed. In the method in which the first structure body S1 and the second structure body S2 are bonded, the first trench T1 and the second trench T2 are formed separately from each other.

For example, there is a first reference example in which a deep trench is formed in the semiconductor region, the first conductive member 51 is formed in the lower portion of the trench, and the second conductive member 52 is subsequently formed in the upper portion of the trench. Because a deep trench is formed in the first reference example, the shape (the depth and the width) of the trench easily becomes nonuniform. Therefore, it is difficult to control the channel length with high precision. In particular, when the channel length is short, the fluctuation of the shape of the trench greatly affects the fluctuation of the channel length. Therefore, in the first reference example, it is difficult to shorten the channel length, and it is difficult to reduce a gate input charge amount Qg. Also, in the first reference example, it is difficult to reduce the overlap amount of the gate. Therefore, in the first reference example, it is difficult to reduce a gate-drain charge amount Qdg. In the first reference example, it is difficult to reduce the fluctuation of the threshold voltage.

Conversely, in the method in which the first structure body S1 and the second structure body S2 are bonded as described above, the first trench T1 and the second trench T2 are formed separately from each other. Therefore, the depth of the first trench T1 is less than the depth of the trench of the first reference example. The depth of the second trench T2 is less than the depth of the trench of the first reference example. The shape (the depth and the width) of the first trench T1 can be controlled with high precision compared to the first reference example. The shape (the depth and the width) of the second trench T2 can be controlled with high precision compared to the first reference example. Therefore, according to the method including bonding, it is easy to shorten the channel length, and the gate input charge amount Qg is more easily reduced. According to the method including bonding, the overlap amount of the gate is more easily reduced, and the gate-drain charge amount Qdg is more easily reduced. According to the method including bonding, it is easy to reduce the fluctuation of the threshold voltage.

In the embodiment, the crystal orientation of the first conductive member 51 may be different from the crystal orientation of the second conductive member 52. When the method of bonding the first structure body S1 and the second structure body S2 is used, a state is easily formed in which the crystal orientations (e.g., the plane orientations) of these conductive members perfectly match. For example, a crystal orientation at which a high mobility is obtained exists in the MOS portion (the portion including the second conductive member 52). On the other hand, a crystal orientation at which a high breakdown voltage is obtained exists in the field plate portion (the portion including the first conductive member 51). These crystal orientations are not always the same. By setting the crystal orientation of the first conductive member 51 to be different from the crystal orientation of the second conductive member 52, for example, the crystal orientation at which the characteristics of the portion including the second conductive member 52 are good and the crystal orientation at which the characteristics of the portion including the first conductive member 51 are good can be controlled independently from each other. Thereby, good characteristics are easily obtained in both portions.

Figure 5:
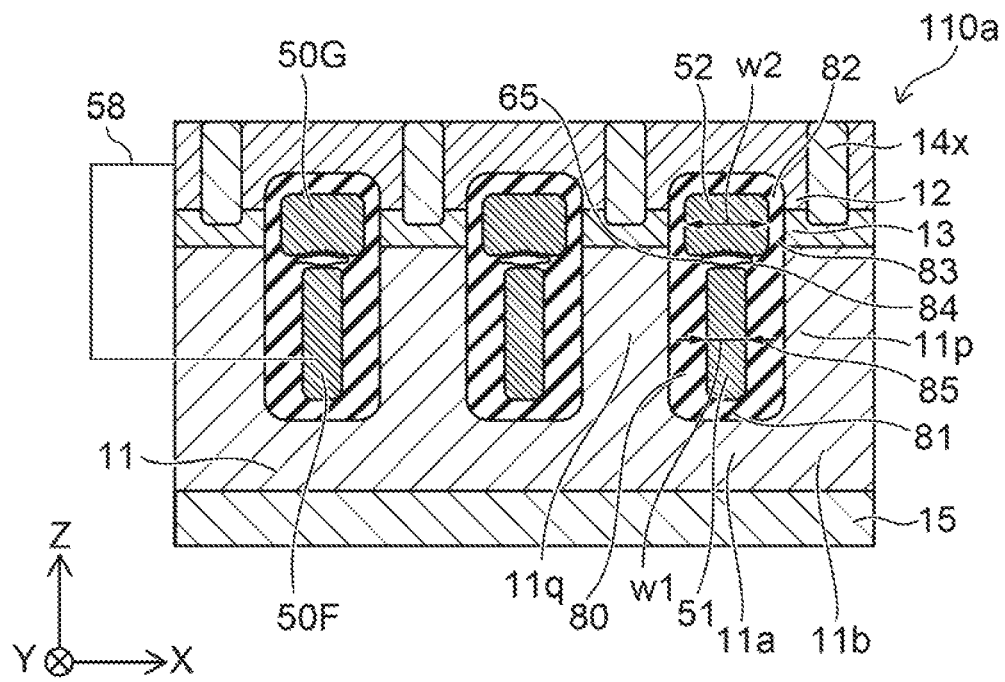
FIG. 5 is a schematic cross-sectional view illustrating a semiconductor device according to the first embodiment.
Figure 6:
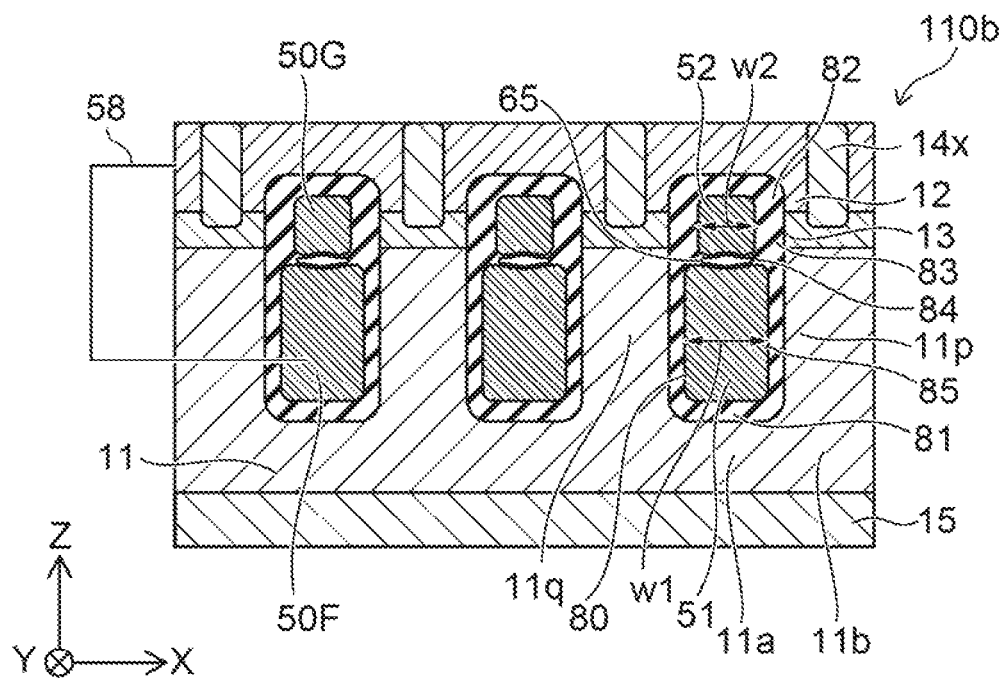
FIG. 6 is a schematic cross-sectional view illustrating a semiconductor device according to the first embodiment.
Figure 7:
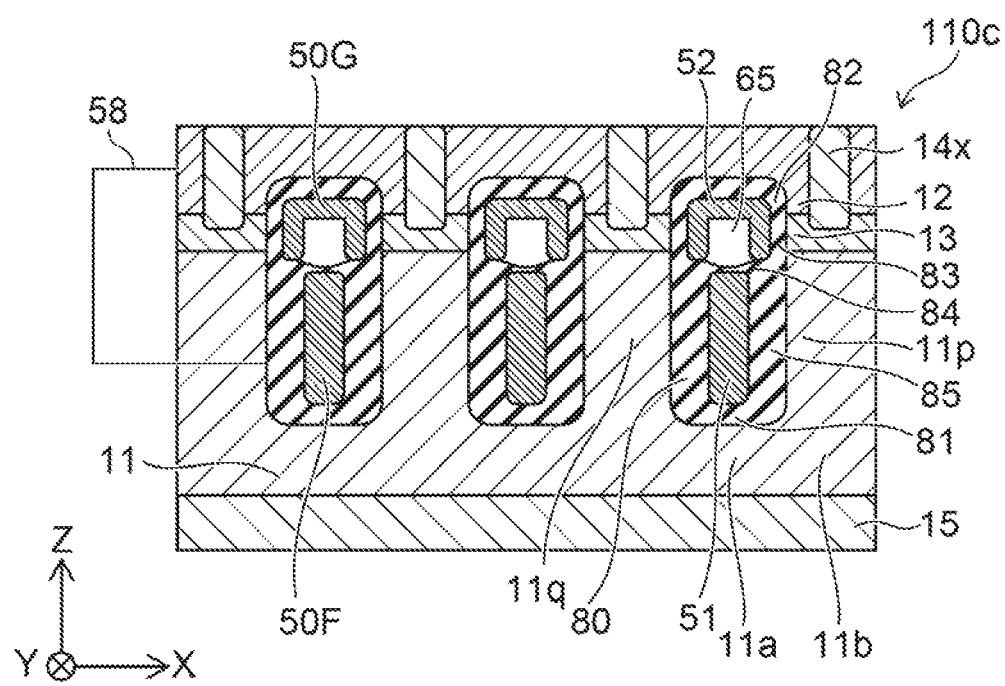
FIG. 7 is a schematic cross-sectional view illustrating a semiconductor device according to the first embodiment.

FIGS. 5 to 7 are schematic cross-sectional views illustrating semiconductor devices according to the first embodiment.

As shown in FIGS. 5 to 7, the semiconductor devices 110*a* to 110*c* according to the embodiment also include the first conductive member 51, the second conductive member 52, the first semiconductor region 11, the second semiconductor region 12, the third semiconductor region 13, and the insulating part 80. The void 65 is between the second conductive member 52 between the first conductive member 51 and the second conductive member 52 in the semiconductor device 110*a* as well.

As shown in FIGS. 5 and 6, the length along the second direction (e.g., the X-axis direction) of the first conductive member 51 is taken as a length w1. The length along the second direction (e.g., the X-axis direction) of the second conductive member 52 is taken as a length w2.

In the semiconductor device 110*a* as shown in FIG. 5, the length w2 is greater than the length w1. By using such a configuration, for example, a high insulating film breakdown voltage in the drift layer is obtained while setting the threshold voltage to an appropriate value.

In the semiconductor device 110*b* as shown in FIG. 6, the length w1 is greater than the length w2. The electrical resistance of the first conductive member 51 can be reduced. By using such a configuration, for example, a high gate insulating film breakdown voltage is obtained while obtaining a high insulating film breakdown voltage in the drift layer.

In the semiconductor device 110*c* as shown in FIG. 7, the second conductive member 52 (e.g., one of the multiple gate electrodes 50G) is concave in the orientation from the first conductive member 51 toward the second conductive member 52. For example, such a configuration is obtained when the formation time of the second conductive member 52 is short. The semiconductor device is obtained with high productivity.

Second Embodiment

Figure 8:
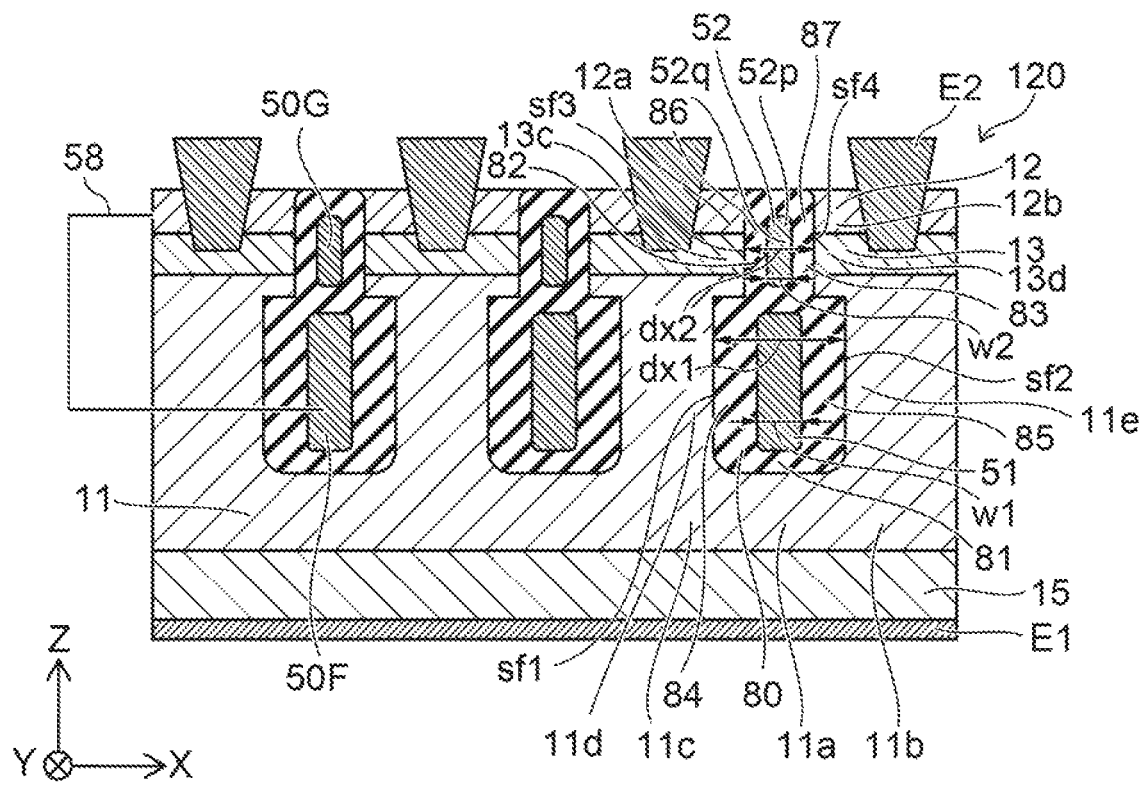
FIG. 8 is a schematic cross-sectional view illustrating a semiconductor device according to a second embodiment.

FIG. 8 is a schematic cross-sectional view illustrating a semiconductor device according to a second embodiment.

As shown in FIG. 8, the semiconductor device 120 according to the second embodiment includes the first conductive member 51, the second conductive member 52, the first semiconductor region 11, the second semiconductor region 12, the third semiconductor region 13, and the insulating part 80.

The direction from the first conductive member 51 toward the second conductive member 52 is along the first direction (e.g., the Z-axis direction).

The first semiconductor region 11 is of the first conductivity type (e.g., the n-type). The first semiconductor region 11 includes the first partial region 11*a*, the second partial region 11*b*, a third partial region 11*c*, a fourth partial region 11*d*, and a fifth partial region 11*e*.

The second direction from the third partial region 11*c* toward the second partial region 11*b* crosses the first direction. The second direction is, for example, the X-axis direction. The first partial region 11*a* is between the third partial region 11*c* and the second partial region 11*b* in the second direction. The first conductive member 51 is between the first partial region 11*a* and the second conductive member 52 in the first direction (the Z-axis direction). The first conductive member 51 is between the fourth partial region 11*d* and the fifth partial region 11*e* in the second direction (e.g., the X-axis direction).

The second semiconductor region 12 is of the first conductivity type (e.g., the n-type). The second semiconductor region 12 includes a first semiconductor portion 12*a* and a second semiconductor portion 12*b*. The direction from the second semiconductor portion 12*b* toward the first semiconductor portion 12*a* is along the second direction (e.g., the X-axis direction). The fourth partial region 11*d* is between the third partial region 11*c* and the first semiconductor portion 12*a* in the first direction (the Z-axis direction). The fifth partial region 11*e* is between the second partial region 11*b* and the second semiconductor portion 12*b* in the first direction. The portion 52*p* of the second conductive member 52 is between the first semiconductor portion 12*a* and the second semiconductor portion 12*b*.

The third semiconductor region 13 is of the second conductivity type (e.g., the p-type). The third semiconductor region 13 includes a third semiconductor portion 13*c* and a fourth semiconductor portion 13*d*. The third semiconductor portion 13*c* is between the fourth partial region 11*d* and the first semiconductor portion 12*a* in the first direction (the Z-axis direction). The fourth semiconductor portion 13*d* is between the fifth partial region 11*e* and the second semiconductor portion 12*b* in the first direction. The other portion 52*q* of the second conductive member 52 is between the third semiconductor portion 13*c* and the fourth semiconductor portion 13*d* in the second direction (the X-axis direction).

The Insulating part 80 includes the first insulating region 81, the second insulating region 82, the third insulating region 83, the fourth insulating region 84, and a fifth insulating region 85. The first insulating region 81, the second insulating region 82, the third insulating region 83, the fourth insulating region 84, and the fifth insulating region 85 may be continuous with each other.

The first insulating region 81 is provided between the first partial region 11*a* and the first conductive member 51 in the first direction (the Z-axis direction). The second insulating region 82 is provided between the third semiconductor portion 13*c* and the other portion 52*q* of the second conductive member 52 in the second direction (e.g., the X-axis direction). The third insulating region 83 is provided between the fourth semiconductor portion 13*d* and the other portion 52*q* of the second conductive member 52 in the second direction (e.g., the X-axis direction). The fourth insulating region 84 is provided between the fourth partial region 11*d* and the first conductive member 51 in the second direction (e.g., the X-axis direction). The fifth insulating region 85 is provided between the first conductive member 51 and the fifth partial region 11*e* in the second direction (e.g., the X-axis direction).

The fourth insulating region 84 includes a first side surface sf1 facing the fourth partial region 11*d*. The fifth insulating region 85 includes a second side surface sf2 facing the fifth partial region 11*e*. The second insulating region 82 includes a third side surface sf3 facing the third semiconductor portion 13*c*. The third insulating region 83 includes a fourth side surface sf4 facing the fourth semiconductor portion 13*d*.

The distance along the second direction (the X-axis direction) between the first side surface sf1 and the second side surface sf2 is taken as a first distance dx1. The distance along the second direction between the third side surface sf3 and the fourth side surface sf4 is taken as a second distance dx2. The first distance dx1 is greater than the second distance dx2.

For example, the first distance dx1 corresponds to the width of the first trench T1 provided in the first structure body S1 (referring to FIG. 3A). For example, the second distance dx2 corresponds to the width of the second trench T2 provided in the second structure body S2 (referring to FIG. 3B).

By setting the first distance dx1 to be greater than the second distance dx2, for example, the shape of the first conductive member 51 can be more stable.

The semiconductor device 120 can be formed by the method described with reference to FIGS. 3A to 4B (the method including bonding). Because the first structure body S1 and the second structure body S2 can be formed independently from each other, the width of the first trench T1 can be easily set to be greater than the width of the second trench T2.

In the semiconductor device 120 as shown in FIG. 8, for example, the length w1 in the second direction (the X-axis direction) of the first conductive member 51 is greater than the length w2 along the second direction (the X-axis direction) of the second conductive member 52. For example, the electrical resistance of the first conductive member 51 can be reduced. For example, the potential of the first conductive member 51 can be more stable, and the electric field distribution can be more effectively controlled.

In the semiconductor device 120, the first conductive member 51 is, for example, one of the multiple field plates 50F. The second conductive member 52 is, for example, one of the multiple gate electrodes 50G. Multiple second electrodes E2 are provided in the semiconductor device 120. One of the multiple second electrodes E2 contacts the third semiconductor region 13 between one of the multiple gate electrodes 50G and another one of the multiple gate electrodes 50G.

The void 65 (referring to FIG. 2) may be provided in the semiconductor device 120. For example, at least one of the first surface 51*f* or the second surface 52*f* may be concave (referring to FIG. 2).

Third Embodiment

Figures 9, 10:
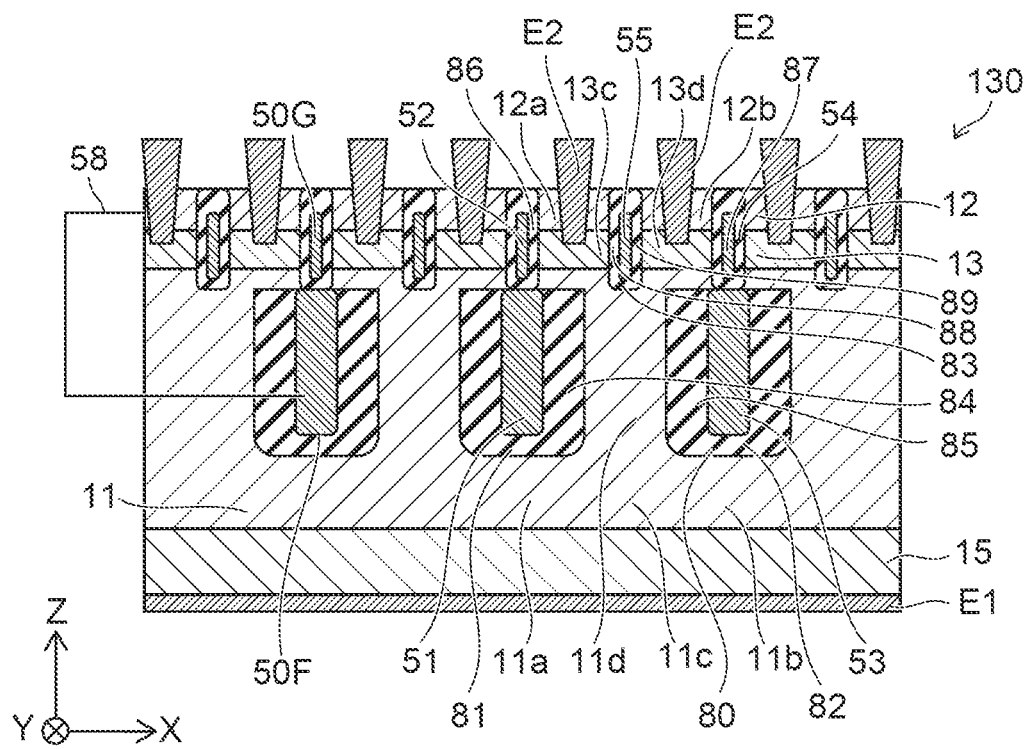
FIG. 9 is a schematic cross-sectional view illustrating a semiconductor device according to a third embodiment.
FIG. 10 is a schematic cross-sectional view illustrating a semiconductor device according to a fourth embodiment.

FIG. 9 is a schematic cross-sectional view illustrating a semiconductor device according to a third embodiment.

As shown in FIG. 9, the semiconductor device 130 according to the third embodiment includes the first conductive member 51, the second conductive member 52, a third conductive member 53, a fourth conductive member 54, a fifth conductive member 55, the first semiconductor region 11, the second semiconductor region 12, the third semiconductor region 13, and the insulating part 80.

The direction from the first conductive member 51 toward the second conductive member 52 is along the first direction (the Z-axis direction). The second direction from the first conductive member 51 toward the third conductive member 53 crosses the first direction. The second direction is, for example, the X-axis direction. The direction from the third conductive member 53 toward the fourth conductive member 54 is along the first direction (the Z-axis direction). The direction from the second conductive member 52 toward the fourth conductive member 54 is along the second direction (e.g., the X-axis direction). The fifth conductive member 55 is provided between the second conductive member 52 and the fourth conductive member 54 in the second direction (e.g., the X-axis direction).

The first semiconductor region 11 is of the first conductivity type (e.g., the n-type). The first semiconductor region 11 includes the first partial region 11*a*, the second partial region 11*b*, the third partial region 11*c*, and the fourth partial region 11*d*. The third partial region 11*c* is between the first partial region 11*a* and the second partial region 11*b* in the second direction. The direction from the first partial region 11*a* toward the second conductive member 52 is along the first direction (the Z-axis direction). The direction from the second partial region 11*b* toward the fourth conductive member 54 is along the first direction. The direction from the third partial region 11*c* toward the fifth conductive member 55 is along the first direction.

The fourth partial region 11*d* is between the third partial region 11*c* and the fifth conductive member 55 in the first direction (the Z-axis direction). The fourth partial region 11*d* is between the first conductive member 51 and the third conductive member 53 in the second direction (e.g., the X-axis direction).

The second semiconductor region 12 is of the first conductivity type (e.g., the n-type). The second semiconductor region 12 includes the first semiconductor portion 12*a* and the second semiconductor portion 12*b*. At least a portion of the first semiconductor portion 12*a* is between the second conductive member 52 and the fifth conductive member 55 in the second direction (e.g., the X-axis direction). At least a portion of the second semiconductor portion 12*b* is between the fifth conductive member 55 and the fourth conductive member 54 in the second direction (e.g., the X-axis direction).

The third semiconductor region 13 is of the second conductivity type (e.g., the p-type). The third semiconductor region 13 includes the third semiconductor portion 13*c* and the fourth semiconductor portion 13*d*. The third semiconductor portion 13*c* is between the first semiconductor region 11 (e.g., the fourth partial region 11*d*) and the first semiconductor portion 12*a* in the first direction (the Z-axis direction). The fourth semiconductor portion 13*d* is between the first semiconductor region 11 (e.g., the fourth partial region 11*d*) and the second semiconductor portion 12*b* in the first direction (the Z-axis direction). The third semiconductor portion 13*c* is between the second conductive member 52 and the fifth conductive member 55 in the second direction (e.g., the X-axis direction). The fourth semiconductor portion 13*d* is between the fifth conductive member 55 and the fourth conductive member 54 in the second direction.

The insulating part 80 includes the first insulating region 81, the second insulating region 82, the third insulating region 83, the fourth insulating region 84, and the fifth insulating region 85. The first insulating region 81 is provided between the first partial region 11a and the first conductive member 51 in the first direction (the Z-axis direction). The second insulating region 82 is provided between the second partial region 11b and the third conductive member 53 in the first direction (the Z-axis direction). The third insulating region 83 is provided between the fourth partial region 11d and the fifth conductive member 55 in the first direction (the Z-axis direction). The fourth insulating region 84 is provided between the first conductive member 51 and the fourth partial region 11d in the second direction (e.g., the X-axis direction). The fifth insulating region 85 is provided between the fourth partial region 11d and the third conductive member 53 in the second direction (e.g., the X-axis direction). For example, the first insulating region 81, the second insulating region 82, the third insulating region 83, the fourth insulating region 84, and the fifth insulating region 85 may be continuous with each other.

The fourth partial region 11d contacts the third insulating region 83, the fourth insulating region 84, and the fifth insulating region 85.

The first conductive member 51 is one of the multiple field plates 50F. The third conductive member 53 is another one of the multiple field plates 50F. The second conductive member 52 is one of the multiple gate electrodes 50G. The fourth conductive member 54 is another one of the multiple gate electrodes 50G. The fifth conductive member 55 also is another one of the multiple gate electrodes 50G.

In the semiconductor device 130, the first conductive member 51 is provided to correspond to the second conductive member 52. The third conductive member 53 is provided to correspond to the fourth conductive member 54. A conductive member (the field plate 50F) that corresponds to the fifth conductive member 55 is not provided.

In the semiconductor device 130, the number of the multiple gate electrodes 50G is greater than the number of the multiple field plates 50F. The number of channels is set to be large. For example, a low channel resistance is obtained while obtaining a high breakdown voltage in the drift layer.

For example, the semiconductor device 130 can be formed by the method described with reference to FIGS. 3A to 4B (the method including bonding). Because the first structure body S1 and the second structure body S2 can be formed independently from each other, the number of the multiple gate electrodes 50G can be different from the number of the multiple field plates 50F. The necessary number of gate electrodes 50G can be provided independently of the number of the multiple field plates 50F. The necessary number of field plates 50F can be provided independently of the number of the multiple gate electrodes 50G.

The void 65 (referring to FIG. 2) may be provided in the semiconductor device 130. For example, at least one of the first surface 51f or the second surface 52f may be concave (referring to FIG. 2).

As shown in FIG. 9, for example, the insulating part 80 may include a sixth insulating region 86, a seventh insulating region 87, an eighth insulating region 88, and a ninth insulating region 89. The sixth insulating region 86 is provided between the second conductive member 52 and the third semiconductor portion 13c in the second direction (e.g., the X-axis direction). The seventh insulating region 87 is provided between the fourth semiconductor portion 13d and the fourth conductive member 54 in the second direction (e.g., the X-axis direction). The eighth insulating region 88 is provided between the third semiconductor portion 13c and the fifth conductive member 55 in the second direction (e.g., the X-axis direction). The ninth insulating region 89 is provided between the fifth conductive member 55 and the fourth semiconductor portion 13d in the second direction (e.g., the X-axis direction).

As shown in FIG. 9, the first electrode E1 and the second electrode E2 may be provided in the semiconductor device 130.

Fourth Embodiment

FIG. 10 is a schematic cross-sectional view illustrating a semiconductor device according to a fourth embodiment.

As shown in FIG. 10, the semiconductor device 140 according to the fourth embodiment includes the first conductive member 51, the second conductive member 52, the third conductive member 53, the first semiconductor region 11, the second semiconductor region 12, the third semiconductor region 13, and the insulating part 80.

The direction from the first conductive member 51 toward the second conductive member 52 is along the first direction (the Z-axis direction).

The third conductive member 53 includes a first conductive portion 53a and a second conductive portion 53b. The first conductive portion 53a and the second conductive portion 53b may be continuous with each other. The first conductive portion 53a is provided between the first conductive member 51 and the second conductive member 52.

The first semiconductor region 11 is of the first conductivity type (e.g., the n-type). The first semiconductor region 11 includes the first partial region 11a, the second partial region 11b, and the third partial region 11c. The second direction from the first partial region 11a toward the second partial region 11b crosses the first direction (the Z-axis direction). The second direction is, for example, the X-axis direction. The first conductive member 51 is between the first partial region 11a and the second conductive member 52 in the first direction (the Z-axis direction).

The second semiconductor region 12 is of the first conductivity type (e.g., the n-type). The direction from the second partial region 11b toward the second semiconductor region 12 is along the first direction (the Z-axis direction). The direction from the portion 52p of the second conductive member 52 toward the second semiconductor region 12 is along the second direction (e.g., the X-axis direction). The third partial region 11c is between the second partial region 11b and the second semiconductor region 12 in the first direction (the Z-axis direction). The second conductive portion 53b of the third conductive member 53 is between the third partial region 11c and the second semiconductor region 12 in the first direction (the Z-axis direction).

The third semiconductor region 13 is of the second conductivity type (e.g., the p-type). The third semiconductor region 13 is provided between the second conductive portion 53b and the second semiconductor region 12 in the first direction (the Z-axis direction). The direction from the other portion 52q of the second conductive member 52 toward the third semiconductor region 13 is along the second direction (e.g., the X-axis direction).

The conductive region 14x may be a semiconductor region. When the conductive region 14x is a semiconductor region, the conductive region 14x is of the first conductivity type (e.g., the n-type). The conductive region 14x is between the second conductive portion 53b and the third semiconductor region 13 in the first direction (the Z-axis direction).

The insulating part 80 includes the first insulating region 81 and the second insulating region 82. The first insulating region 81 is provided between the first conductive member 51 and the first conductive portion 53a. The second insulating region 82 is provided between the first conductive portion 53a and the second conductive member 52.

The insulating part 80 may further include the third insulating region 83, the fourth insulating region 84, and the fifth insulating region 85. The third insulating region 83 is between the first partial region 11a and the first conductive member 51 in the first direction. The fourth insulating region 84 is between the second semiconductor region 12 and the portion 52p of the second conductive member 52 described above in the second direction. The fifth insulating region 85 is between the third semiconductor region 13 and the other portion 52q of the second conductive member 52 described above in the second direction.

The fifth semiconductor region 15 and the first electrode E1 are provided in the example. The fifth semiconductor region 15 is between the first electrode E1 and the first semiconductor region 11 in the first direction (the Z-axis direction). For example, the second semiconductor region 12 is electrically connected to the second electrode E2.

For example, the second conductive portion 53b contacts the third partial region 11c and contacts the conductive region 14x. The third partial region 11c and the conductive region 14x are electrically connected to each other by the second conductive portion 53b.

For example, the first conductive member 51 functions as the gate of one transistor. For example, the second conductive member 52 functions as the gate of another transistor. These transistors are electrically connected to each other.

Figure 11:
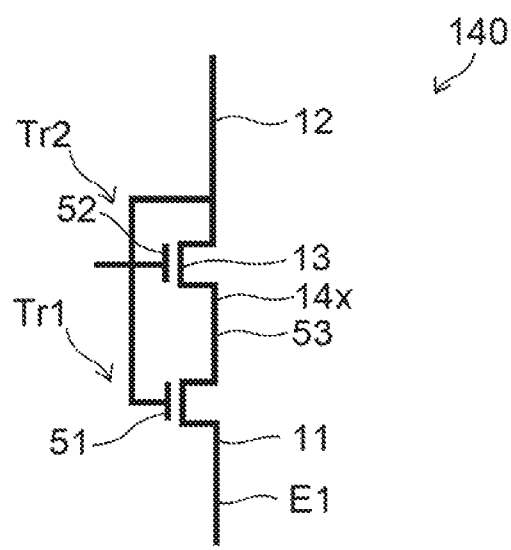
FIG. 11 is a schematic view illustrating the semiconductor device according to the fourth embodiment.

FIG. 11 is a schematic view illustrating the semiconductor device according to the fourth embodiment.

As shown in FIG. 11, the semiconductor device 110 includes a first transistor Tr1 and a second transistor Tr2. The first conductive member 51 functions as the gate of the first transistor Tr1. The second conductive member 52 functions as the gate of the second transistor Tr2. The first conductive member 51, which is the gate of the first transistor Tr1, is electrically connected to the second semiconductor region 12, which is the source of the second transistor Tr2. The first transistor Tr1 and the second transistor Tr2 have a cascode connection with each other. A cascode circuit is formed of these transistors.

For example, the semiconductor device 140 can be formed by the method described with reference to FIGS. 3A to 4B (the method including bonding). A conductive film that is used to form the third conductive member 53 is formed in at least one of the first structure body S1 or the second structure body S2. Subsequently, the semiconductor device 140 is obtained by bonding the first structure body S1 and the second structure body S2. By using the method including bonding, misalignment in the semiconductor device 140 can be suppressed.

The void 65 (referring to FIG. 2) may be provided in the semiconductor device 140. For example, at least one of the first surface 51f or the second surface 52f may be concave (referring to FIG. 2).

The configuration described in reference to the first embodiment (e.g., the materials of the conductive members, the semiconductor regions, and the insulating part 80, etc.) is applicable to the semiconductor devices according to the second to fourth embodiments.

Fifth Embodiment

Figure 12:
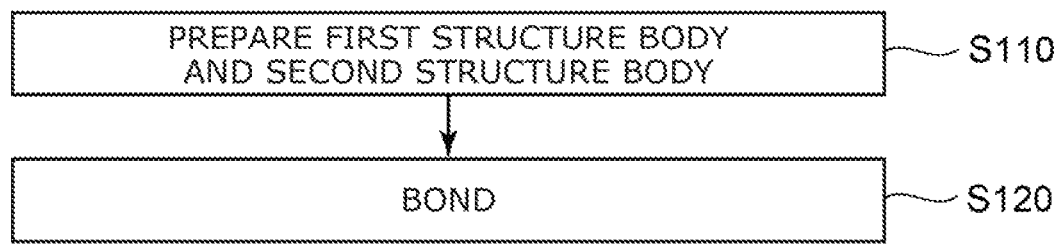
FIG. 12 is a flowchart illustrating a method for manufacturing a semiconductor device according to a fifth embodiment.

FIG. 12 is a flowchart illustrating a method for manufacturing a semiconductor device according to a fifth embodiment.

FIGS. 13A, 13B, 14A, and 14B are schematic cross-sectional views illustrating the method for manufacturing the semiconductor device according to the fifth embodiment.

Figure 13A:
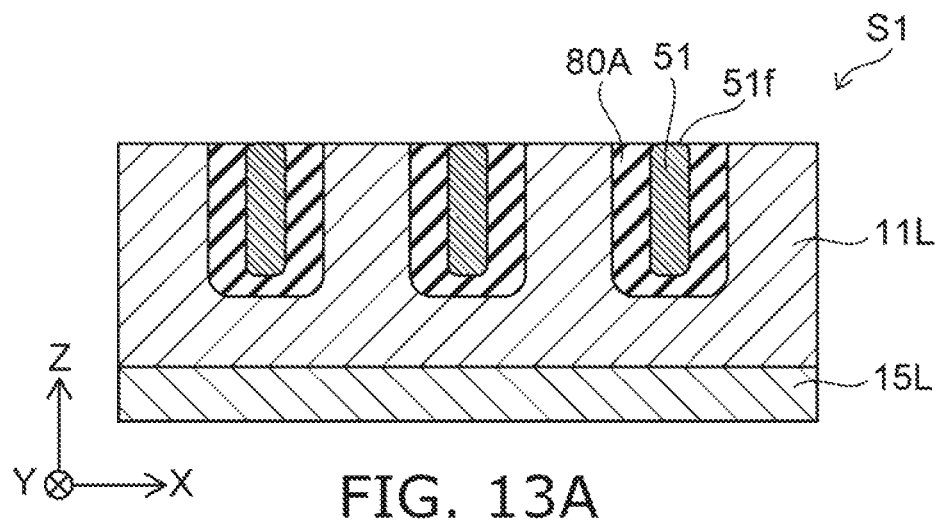
FIGS. 13A and 13B are schematic cross-sectional views illustrating the method for manufacturing the semiconductor device according to the fifth embodiment.

As shown in FIG. 12, the method for manufacturing the semiconductor device according to the fifth embodiment includes preparing the first structure body S1 (referring to FIG. 13A) and the second structure body S2 (referring to FIG. 13B) (step S110). As shown in FIG. 13A, the first structure body S1 includes the first semiconductor layer 11L of the first conductivity type, the first conductive member 51, and the first insulating part 80A provided between the first semiconductor layer 11L and the first conductive member 51.

Figure 13B:
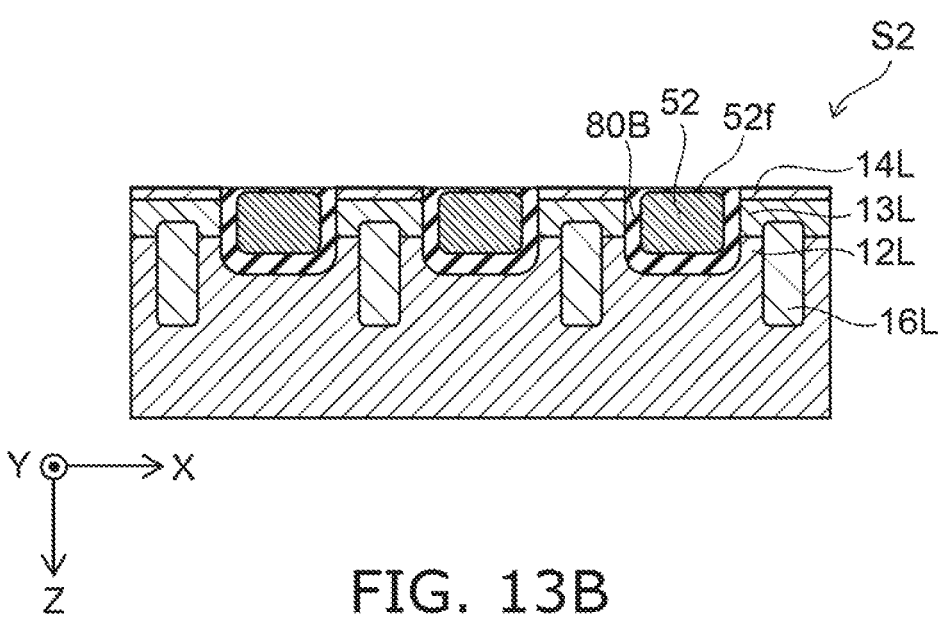

As shown in FIG. 13B, the second structure body S2 includes the second semiconductor layer 12L of the first conductivity type, the third semiconductor layer 13L of the second conductivity type, the fourth semiconductor layer 14L of the first conductivity type, the second conductive member 52, and the second insulating part 80B. The third semiconductor layer 13L is between the second semiconductor layer 12L and the fourth semiconductor layer 14L. The second insulating part 80B is between the second semiconductor layer 12L and the second conductive member 52, between the third semiconductor layer 13L and the second conductive member 52, and between the fourth semiconductor layer 14L and the second conductive member 52.

Figure 14A:
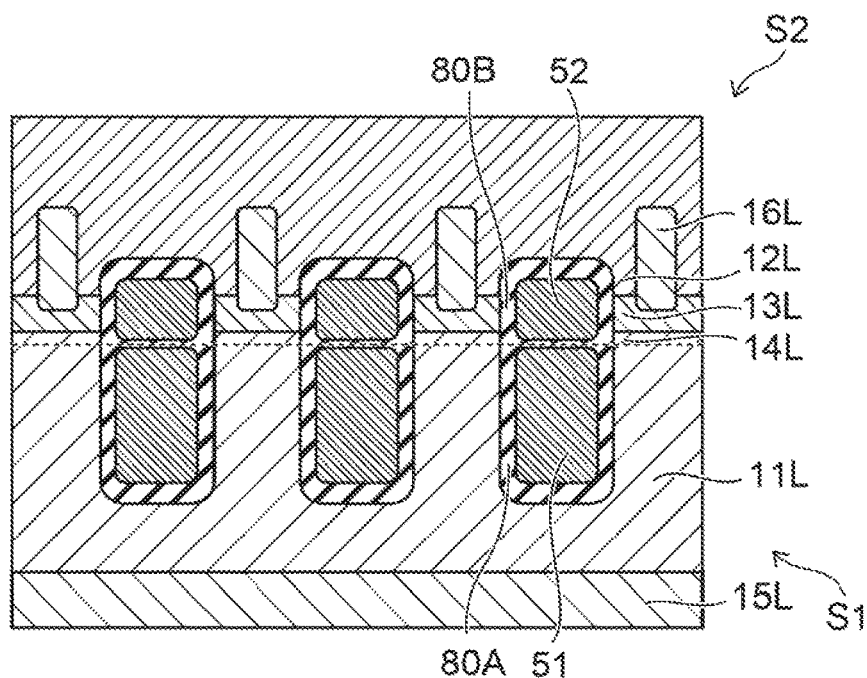
FIGS. 14A and 14B are schematic cross-sectional views illustrating the method for manufacturing the semiconductor device according to the fifth embodiment.
Figure 14B:
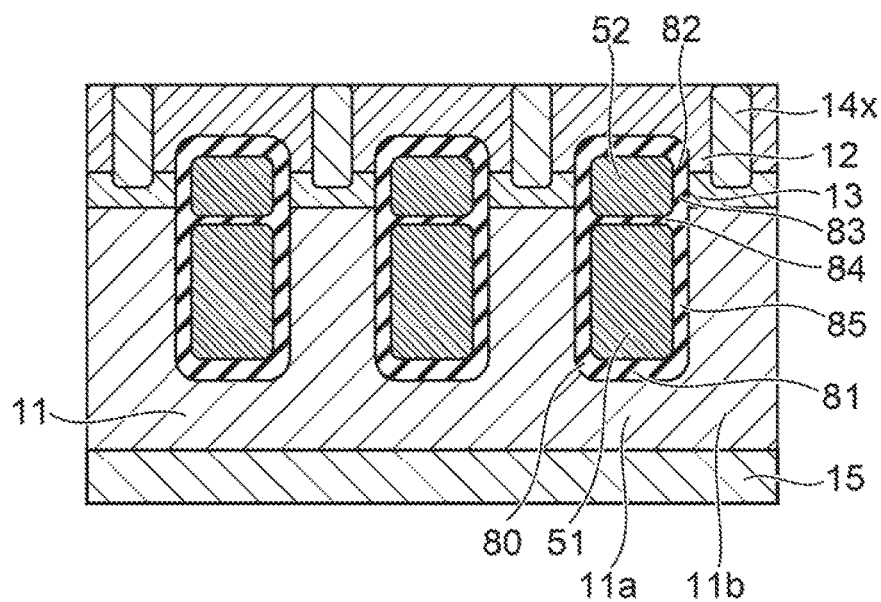

As shown in FIG. 12, the manufacturing method includes bonding the first semiconductor layer 11L and the fourth semiconductor layer 14L (step S120). For example, as shown in FIG. 14A, the first surface 51f and the second surface 52f are caused to face each other. Then, the first semiconductor layer 11L and the fourth semiconductor layer 14L are bonded. As shown in FIG. 14B, a portion of the second semiconductor layer 12L is removed. Any semiconductor device described in reference to the first to fourth embodiments is obtained thereby.

According to the manufacturing method described above, for example, it is easy to shorten the channel length, and the gate input charge amount Qg is more easily reduced. For example, the overlap amount of the gate is more easily reduced, and the gate-drain charge amount Qdg is more easily reduced. For example, it is easy to reduce the fluctuation of the threshold voltage.

The manufacturing method described above may further include making at least one of the first surface 51f of the first conductive member 51 (referring to FIG. 3A) or the second surface 52f of the second conductive member 52 (referring to FIG. 3B) concave before the bonding. The bonding includes causing the second surface 52f to face the first surface 51f. For example, the void 65 may be formed.

Sixth Embodiment

Figure 15:
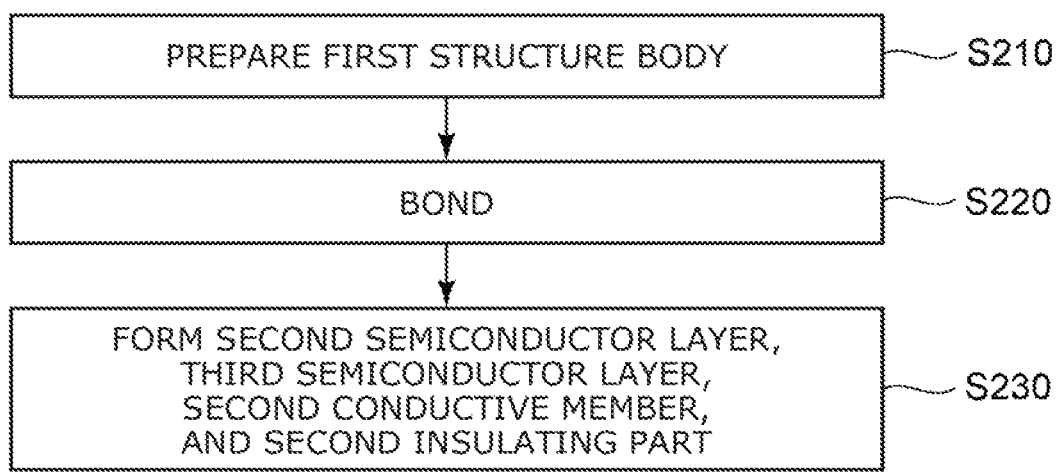
FIG. 15 is a flowchart illustrating a method for manufacturing a semiconductor device according to a sixth embodiment.

FIG. 15 is a flowchart illustrating a method for manufacturing a semiconductor device according to a sixth embodiment.

Figure 16A:
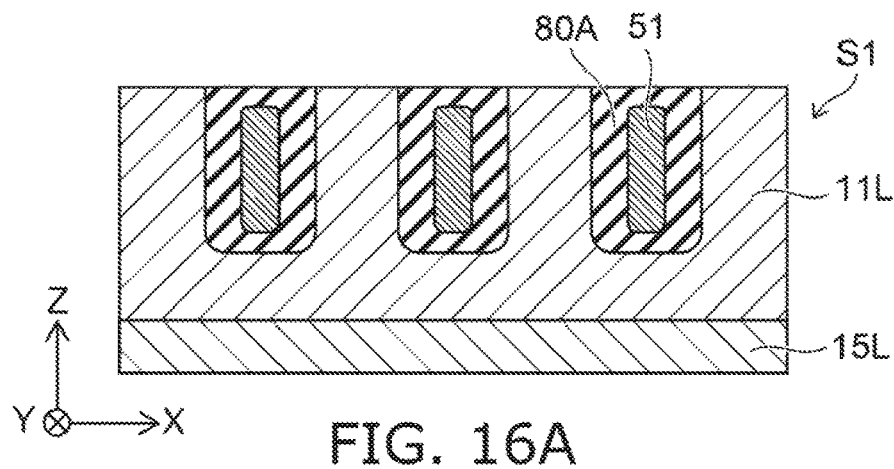
FIGS. 16A, 16B, and 16C are schematic cross-sectional views illustrating the method for manufacturing the semiconductor device according to the sixth embodiment.
Figure 16B:
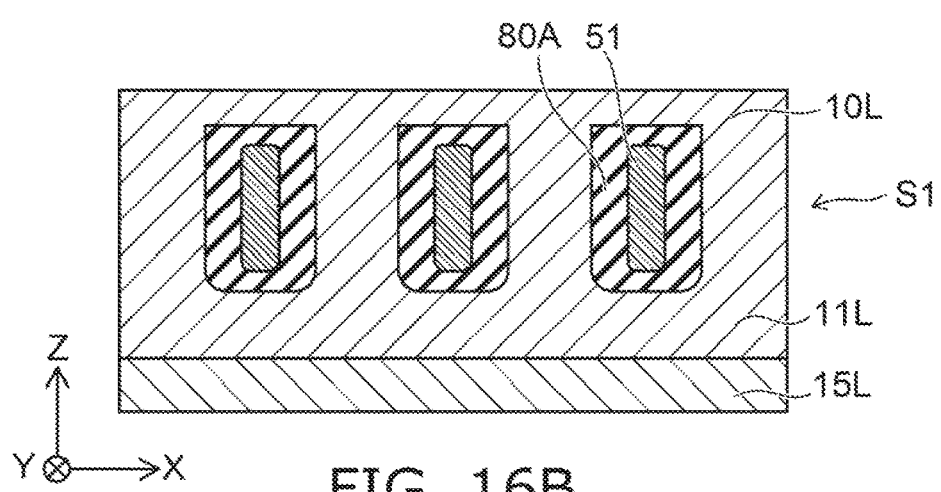
Figure 16C:
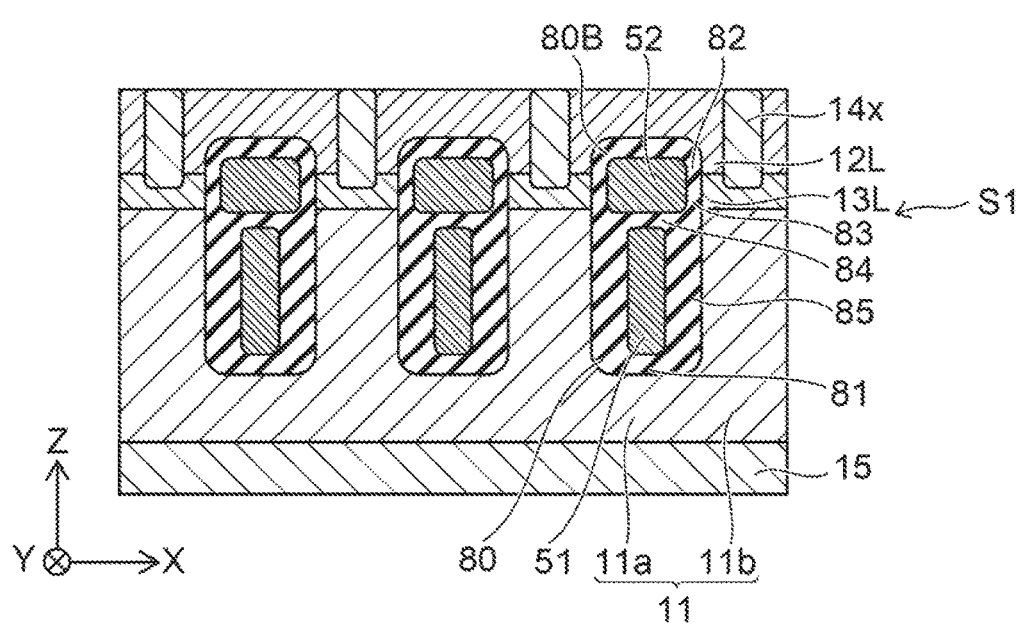

FIGS. 16A, 16B, and 16C are schematic cross-sectional views illustrating the method for manufacturing the semiconductor device according to the sixth embodiment.

As shown in FIG. 15, the method for manufacturing the semiconductor device according to the sixth embodiment includes preparing the first structure body S1 (step S210). As shown in FIG. 16A, the first structure body S1 includes the first semiconductor layer 11L of the first conductivity type, the first conductive member 51, and the first insulating part 80A provided between the first semiconductor layer 11L and the first conductive member 51. In the example, the first structure body S1 includes the fifth semiconductor layer 15L.

As shown in FIG. 15, the manufacturing method includes bonding a semiconductor member 10L (referring to FIG. 16B) to the first structure body S1 (step S220). For example, the semiconductor member 10L is provided on the first conductive member 51 and the first insulating part 80A. The semiconductor member 10L may be, for example, a semiconductor substrate. For example, the semiconductor substrate may be bonded to the first structure body S1, and the semiconductor substrate may be subsequently thinned by a method such as polishing, etc.

As shown in FIGS. 15 and 16C, the manufacturing method includes forming the second semiconductor layer 12L of the first conductivity type, the third semiconductor layer 13L of the second conductivity type, the second conductive member 52, and the second insulating part 80B (step S230). At least the second semiconductor layer 12L and the third semiconductor layer 13L are formed from the semiconductor member 10L. For example, the second semiconductor layer 12L and the third semiconductor layer 13L can be formed by ion implantation, etc. The third semiconductor layer 13L is between the second semiconductor layer 12L and the first structure body S1. The second insulating part 80B is at least between the second semiconductor layer 12L and the second conductive member 52 and between the third semiconductor layer 13L and the second conductive member 52.

In the manufacturing method according to the sixth embodiment, the trench T1, in which the first conductive member 51 is formed, is formed separately from the formation of the second conductive member 52. In this method as well, for example, it is easy to shorten the channel length, and the gate input charge amount Qg is more easily reduced. For example, the overlap amount of the gate is more easily reduced, and the gate-drain charge amount Qdg is more easily reduced. For example, it is easy to reduce the fluctuation of the threshold voltage.

Seventh Embodiment

Figure 17:
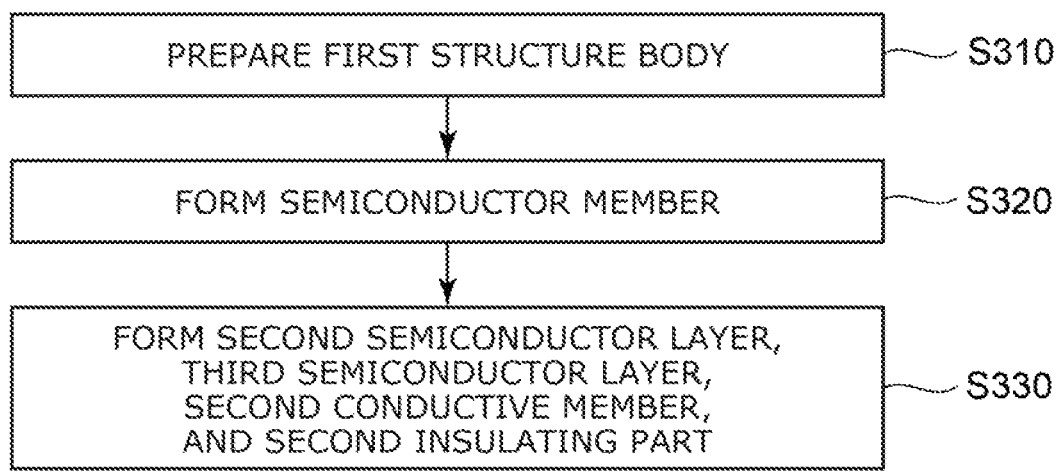
FIG. 17 is a flowchart illustrating a method for manufacturing a semiconductor device according to a seventh embodiment.

FIG. 17 is a flowchart illustrating a method for manufacturing a semiconductor device according to a seventh embodiment.

FIGS. 18A, 18B, 19A, and 19B are schematic cross-sectional views illustrating the method for manufacturing the semiconductor device according to the seventh embodiment.

Figure 18A:
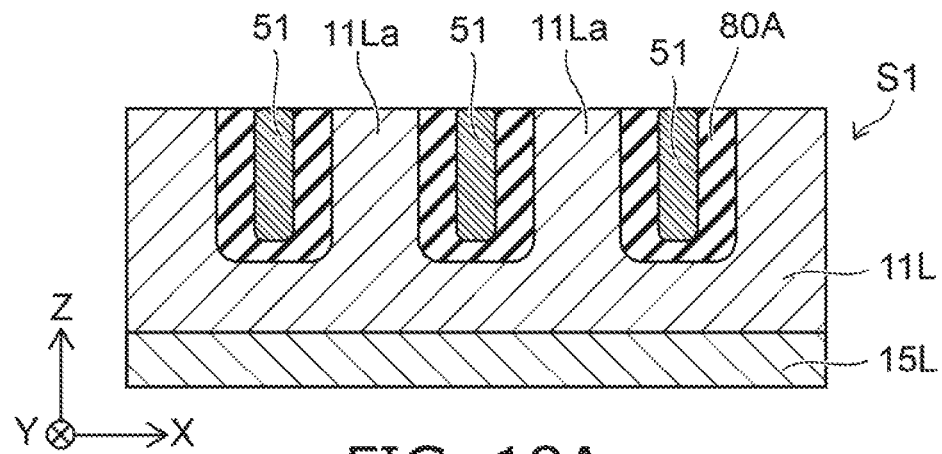
FIGS. 18A and 18B are schematic cross-sectional views illustrating the method for manufacturing the semiconductor device according to the seventh embodiment.

As shown in FIG. 17, the manufacturing method according to the seventh embodiment includes preparing the first structure body S1 (step S310). As shown in FIG. 18A, the first structure body S1 includes the first semiconductor layer 11L of the first conductivity type, the multiple first conductive members 51, and the first insulating part 80A provided between the first semiconductor layer 11L and the multiple first conductive members 51. The first semiconductor layer 11L includes a region 11La between the multiple first conductive members 51.

Figure 18B:
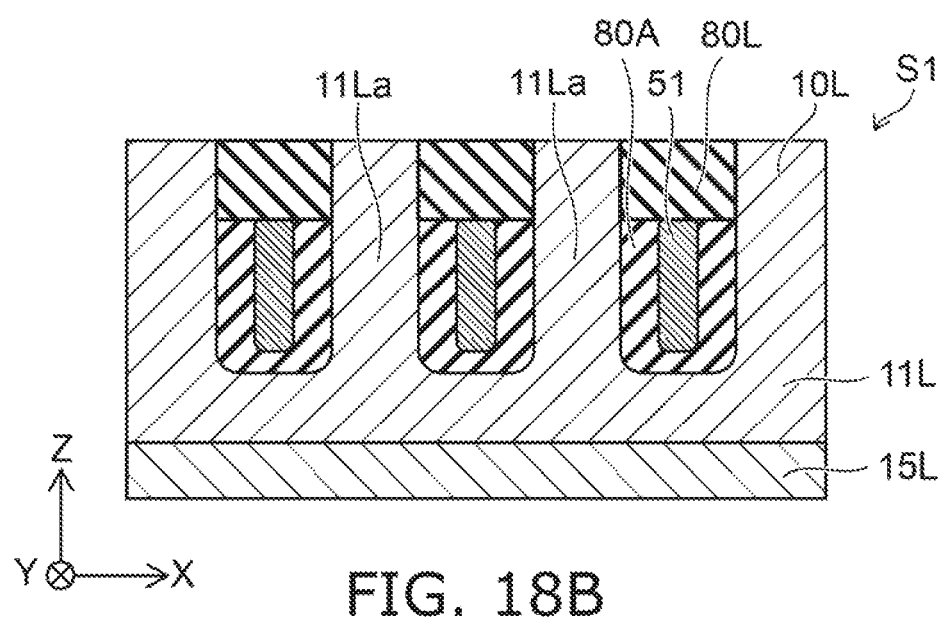

As shown in FIGS. 17 and 18B, the manufacturing method includes forming the semiconductor member 10L on the region 11La between the multiple first conductive members 51 described above (step S320). In the embodiment, for example, crystal growth of the semiconductor member 10L on the region 11La described above may be performed after forming an insulating layer 80L on the first conductive member 51 of the first structure body S1. In the embodiment, the insulating layer 80L may be formed after forming the semiconductor member 10L on the first structure body S1.

Figure 19A:
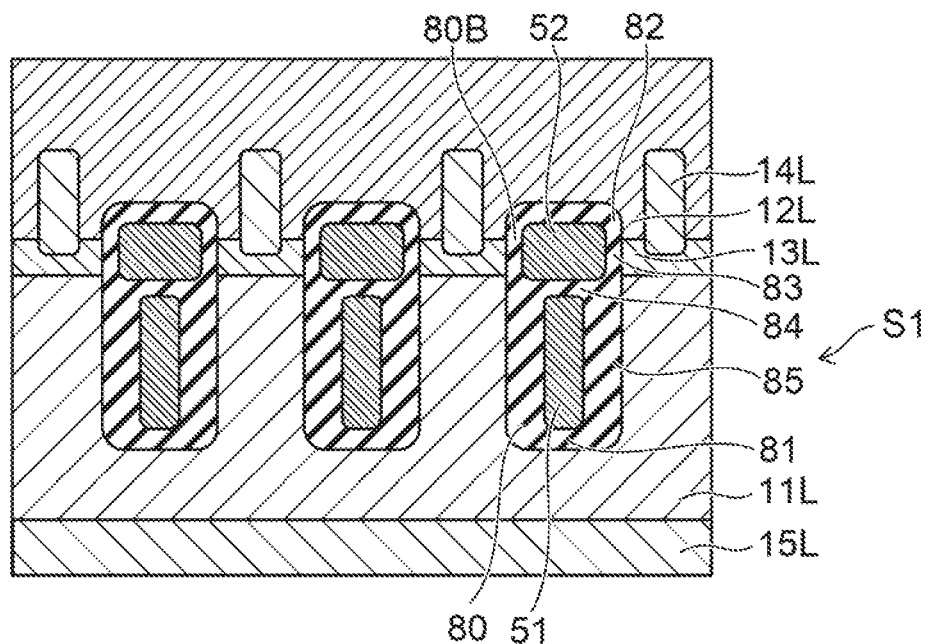
FIGS. 19A and 19B are schematic cross-sectional views illustrating the method for manufacturing the semiconductor device according to the seventh embodiment.

As shown in FIGS. 17 and 19A, the manufacturing method may include forming the second semiconductor layer 12L of the first conductivity type, the third semiconductor layer 13L of the second conductivity type, the second conductive member 52, and the second insulating part 80S (step S330). At least the second semiconductor layer 12L and the third semiconductor layer 13L are formed from the semiconductor member 10L. The third semiconductor layer 13L is between the second semiconductor layer 12L and the first structure body S1. The second insulating part 80B is between the second semiconductor layer 12L and the second conductive member 52 and between the third semiconductor layer 13L and the second conductive member 52. The fourth semiconductor layer 14L is further provided in the example.

For example, the second conductive member 52 may be formed by filling a conductive material after removing, for example, a portion of the insulating layer 80L.

Figure 19B:
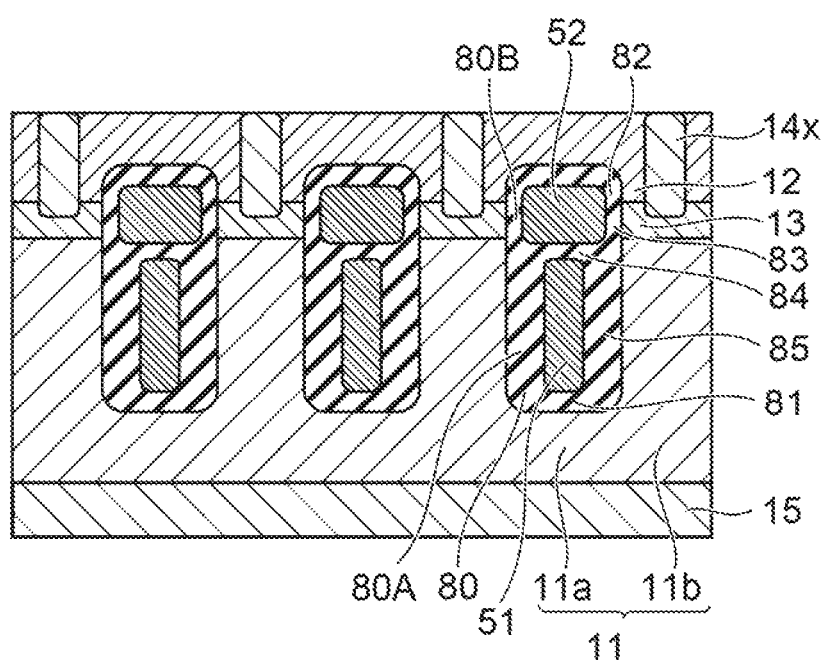

As shown in FIGS. 19A and 19B, for example, the fourth semiconductor layer 14L is exposed by removing a portion of the second semiconductor layer 12L. The semiconductor device is obtained thereby. For example, the first semiconductor region 11 is obtained from the first semiconductor layer 11L. For example, the second semiconductor region 12 is obtained from the second semiconductor layer 12L. For example, the third semiconductor region 13 is obtained from the third semiconductor layer 13L. For example, the conductive region 14x is obtained from the fourth semiconductor layer 14L.

In the manufacturing method according to the seventh embodiment, the trench T1, in which the first conductive member 51 is formed, is formed separately from the formation of the second conductive member 52. In this method as well, for example, it is easy to shorten the channel length, and the gate input charge amount Qg is more easily reduced. For example, the overlap amount of the gate is more easily reduced, and the gate-drain charge amount Qdg is more easily reduced. For example, it is easy to reduce the fluctuation of the threshold voltage.

In the first to seventh embodiments described above, the crystal orientation of the first conductive member 51 may be different from the crystal orientation of the second conductive member 52. For example, the crystal orientation at which the characteristics of the portion including the second conductive member 52 are good and the crystal orientation at which the characteristics of the portion including the first conductive member 51 are good can be controlled independently from each other.

The embodiments may include the following configurations (e.g., technological proposals).

Configuration 1

A semiconductor device, comprising:

a first conductive member;

a second conductive member, a direction from the first conductive member toward the second conductive member being along a first direction;

a first semiconductor region of a first conductivity type, the first semiconductor region including a first partial region and a second partial region, a second direction from the first partial region toward the second partial region crossing the first direction, the first conductive member being between the first partial region and the second conductive member in the first direction;

a second semiconductor region of the first conductivity type, a direction from the second partial region toward the second semiconductor region being along the first direction, a direction from a portion of the second conductive member toward the second semiconductor region being along the second direction;

a third semiconductor region of a second conductivity type, the third semiconductor region being between the second partial region and the second semiconductor region in the first direction, a direction from an other portion of the second conductive member toward the third semiconductor region being along the second direction; and an insulating part including a first insulating region provided between the first partial region and the first conductive member in the first direction, a second insulating region provided between the second semiconductor region and the portion of the second conductive member in the second direction, and a third insulating region provided between the third semiconductor region and the other portion of the second conductive member in the second direction, a void being between the first conductive member and the second conductive member.

Configuration 2

The semiconductor device according to Configuration 1, wherein the first conductive member includes a first surface facing the second conductive member, and the first surface is concave.

Configuration 3

The semiconductor device according to Configuration 1 or 2, wherein the second conductive member includes a second surface facing the first conductive member, and the second surface is concave.

Configuration 4

A semiconductor device, comprising:

a first conductive member;

a second conductive member, a direction from the first conductive member toward the second conductive member being along a first direction;

a first semiconductor region of a first conductivity type, the first semiconductor region including a first partial region and a second partial region, a second direction from the first partial region toward the second partial region crossing the first direction, the first conductive member being between the first partial region and the second conductive member in the first direction;

a second semiconductor region of the first conductivity type, a direction from the second partial region toward the second semiconductor region being along the first direction, a direction from a portion of the second conductive member toward the second semiconductor region being along the second direction;

a third semiconductor region of a second conductivity type, the third semiconductor region being provided between the second partial region and the second semiconductor region in the first direction, a direction from an other portion of the second conductive member toward the third semiconductor region being along the second direction; and an insulating part including a first insulating region provided between the first partial region and the first conductive member in the first direction, a second insulating region provided between the second semiconductor region and the portion of the second conductive member in the second direction, and a third insulating region provided between the third semiconductor region and the other portion of the second conductive member in the second direction, the first conductive member including a first surface facing the second conductive member, the first surface being concave.

Configuration 5

The semiconductor device according to Configuration 4, wherein the second conductive member includes a second surface facing the first conductive member, and the second surface is concave.

Configuration 6

The semiconductor device according to any one of Configurations 1 to 5, wherein the insulating part further includes a fourth insulating region, and the fourth insulating region is provided between at least a portion of the first conductive member and at least a portion of the second conductive member in the first direction.

Configuration 7

The semiconductor device according to any one of Configurations 1 to 6, wherein a crystal orientation of the first conductive member is different from a crystal orientation of the second conductive member.

Configuration 8

The semiconductor device according to any one of Configurations 1 to 7, further comprising:

a conductive region, at least a portion of the second semiconductor region being between the conductive region and the portion of the second conductive member in the second direction, the conductive region being a semiconductor region, a concentration of an impurity of the second conductivity type in the conductive region being greater than a concentration of the impurity of the second conductivity type in the third semiconductor region.

Configuration 9

The semiconductor device according to Configuration 8, wherein the conductive region contacts the third semiconductor region.

Configuration 10

The semiconductor device according to any one of Configurations 1 to 8, further comprising:

a first electrode and a second electrode, the first partial region being between the first electrode and the first conductive member in the first direction, the first electrode being electrically connected to the first semiconductor region, the second electrode being electrically connected to the second semiconductor region.

Configuration 11

The semiconductor device according to Configuration 10, further comprising:

a fifth semiconductor region of the first conductivity type, at least a portion of the fifth semiconductor region being between the first electrode and the first semiconductor region in the first direction, a concentration of an impurity of the first conductivity type in the fifth semiconductor region being greater than a concentration of the impurity of the first conductivity type in the first semiconductor region.

Configuration 12

A semiconductor device, comprising:

a first conductive member;

a second conductive member, a direction from the first conductive member toward the second conductive member being along a first direction;

a first semiconductor region of a first conductivity type, the first semiconductor region including a first partial region, a second partial region, a third partial region, a fourth partial region, and a fifth partial region, a second direction from the third partial region toward the second partial region crossing the first direction, the first partial region being between the third partial region and the second partial region in the second direction, the first conductive member being between the first partial region and the second conductive member in the first direction, the first conductive member being between the fourth partial region and the fifth partial region in the second direction;

a second semiconductor region of the first conductivity type, the second semiconductor region including a first semiconductor portion and a second semiconductor portion, a direction from the second semiconductor portion toward the first semiconductor portion being along the second direction, the fourth partial region being between the third partial region and the first semiconductor portion in the first direction, the fifth partial region being between the second partial region and the second semiconductor portion in the first direction, a portion of the second conductive member being between the first semiconductor portion and the second semiconductor portion;

a third semiconductor region of a second conductivity type, the third semiconductor region including a third semiconductor portion and a fourth semiconductor portion, the third semiconductor portion being between the fourth partial region and the first semiconductor portion in the first direction, the fourth semiconductor portion being between the fifth partial region and the second semiconductor portion in the first direction, an other portion of the second conductive member being between the third semiconductor portion and the fourth semiconductor portion in the second direction; and an insulating part including a first insulating region provided between the first partial region and the first conductive member in the first direction, a second insulating region provided between the third semiconductor portion and the other portion of the second conductive member in the second direction, a third insulating region provided between the fourth semiconductor portion and the other portion of the second conductive member in the second direction, a fourth insulating region provided between the fourth partial region and the first conductive member in the second direction, and a fifth insulating region provided between the first conductive member and the fifth partial region in the second direction, the fourth insulating region including a first side surface facing the fourth partial region, the fifth insulating region including a second side surface facing the fifth partial region, the second insulating region including a third side surface facing the third semiconductor portion, the third insulating region including a fourth side surface facing the fourth semiconductor portion, a first distance along the second direction between the first side surface and the second side surface being greater than a second distance along the second direction between the third side surface and the fourth side surface.

Configuration 13

The semiconductor device according to Configuration 12, wherein a length along the second direction of the first conductive member is greater than a length along the second direction of the second conductive member.

Configuration 14

A semiconductor device, comprising:

a first conductive member;

a second conductive member, a direction from the first conductive member toward the second conductive member being along a first direction;

a third conductive member, a second direction from the first conductive member toward the third conductive member crossing the first direction;

a fourth conductive member, a direction from the third conductive member toward the fourth conductive member being along the first direction, a direction from the second conductive member toward the fourth conductive member being along the second direction;

a fifth conductive member provided between the second conductive member and the fourth conductive member in the second direction;

a first semiconductor region of a first conductivity type, the first semiconductor region including a first partial region, a second partial region, a third partial region, and a fourth partial region, the third partial region being between the first partial region and the second partial region in the second direction, a direction from the first partial region toward the second conductive member being along the first direction, a direction from the second partial region toward the fourth conductive member being along the first direction, a direction from the third partial region toward the fifth conductive member being along the first direction, the fourth partial region being between the third partial region and the fifth conductive member in the first direction, the fourth partial region being between the first conductive member and the third conductive member in the second direction;

a second semiconductor region of the first conductivity type, the second semiconductor region including a first semiconductor portion and a second semiconductor portion, at least a portion of the first semiconductor portion being between the second conductive member and the fifth conductive member in the second direction, at least a portion of the second semiconductor portion being between the fifth conductive member and the fourth conductive member in the second direction;

a third semiconductor region of a second conductivity type, the third semiconductor region including a third semiconductor portion and a fourth semiconductor portion, the third semiconductor portion being between the first semiconductor region and the first semiconductor portion in the first direction, the fourth semiconductor portion being between the first semiconductor region and the second semiconductor portion in the first direction, the third semiconductor portion being between the second conductive member and the fifth conductive member in the second direction, the fourth semiconductor portion being between the fifth conductive member and the fourth conductive member in the second direction; and an insulating part including a first insulating region provided between the first partial region and the first conductive member in the first direction, a second insulating region provided between the second partial region and the third conductive member in the first direction, a third insulating region provided between the fourth partial region and the fifth conductive member in the first direction, a fourth insulating region provided between the first conductive member and the fourth partial region in the second direction, and a fifth insulating region provided between the fourth partial region and the third conductive member in the second direction, the fourth partial region contacting the third insulating region, the fourth insulating region, and the fifth insulating region.

Configuration 15

The semiconductor device according to Configuration 14, wherein the insulating part further includes:
a sixth insulating region provided between the second conductive member and the third semiconductor portion in the second direction;
a seventh insulating region provided between the fourth semiconductor portion and the fourth conductive member in the second direction;
an eighth insulating region provided between the third semiconductor portion and the fifth conductive member in the second direction; and
a ninth insulating region provided between the fifth conductive member and the fourth semiconductor portion in the second direction.

Configuration 16

A semiconductor device, comprising:
a first conductive member;
a second conductive member, a direction from the first conductive member toward the second conductive member being along a first direction;
a third conductive member, the third conductive member including a first conductive portion and a second conductive portion, the first conductive portion being provided between the first conductive member and the second conductive member;
a first semiconductor region of a first conductivity type, the first semiconductor region including a first partial region, a second partial region, a third partial region, and a fourth partial region, a second direction from the first partial region toward the second partial region crossing the first direction, the first conductive member being between the first partial region and the second conductive member in the first direction;
a second semiconductor region of the first conductivity type, a direction from the second partial region toward the second semiconductor region being along the first direction, a direction from a portion of the second conductive member toward the second semiconductor region being along the second direction, the third partial region being between the second partial region and the second semiconductor region in the first direction, the second conductive portion being between the third partial region and the second semiconductor region in the first direction;
a third semiconductor region of a second conductivity type, the third semiconductor region being provided between the second conductive portion and the second semiconductor region in the first direction, a direction from an other portion of the second conductive member toward the third semiconductor region being along the second direction;

a fourth semiconductor region of the first conductivity type, the fourth semiconductor region being between the second conductive portion and the third semiconductor region in the first direction; and an insulating part including
a first insulating region provided between the first conductive member and the first conductive portion, and
a second insulating region provided between the first conductive portion and the second conductive member.

Configuration 17

The semiconductor device according to Configuration 16, wherein the second conductive portion contacts the third partial region and contacts the fourth semiconductor region.

Configuration 18

A semiconductor device, comprising:
a first conductive member;
a second conductive member, a direction from the first conductive member toward the second conductive member being along a first direction;
a first semiconductor region of a first conductivity type, the first semiconductor region including a first partial region and a second partial region, a second direction from the first partial region toward the second partial region crossing the first direction, the first conductive member being between the first partial region and the second conductive member in the first direction;
a second semiconductor region of the first conductivity type, a direction from the second partial region toward the second semiconductor region being along the first direction, a direction from a portion of the second conductive member toward the second semiconductor region being along the second direction;
a third semiconductor region of a second conductivity type, the third semiconductor region being between the second partial region and the second semiconductor region in the first direction, a direction from an other portion of the second conductive member toward the third semiconductor region being along the second direction; and
an insulating part including
a first insulating region provided between the first partial region and the first conductive member in the first direction,
a second insulating region provided between the second semiconductor region and the portion of the second conductive member in the second direction, and
a third insulating region provided between the third semiconductor region and the other portion of the second conductive member in the second direction, a crystal orientation of the first conductive member being different from a crystal orientation of the second conductive member.

Configuration 19

A method for manufacturing a semiconductor device, the method comprising:
preparing a first structure body and a second structure body,
the first structure body including a first semiconductor layer of a first conductivity type, a first conductive member, and a first insulating part provided between the first semiconductor layer and the first conductive member,
the second structure body including a second semiconductor layer of the first conductivity type, a third semiconductor layer of a second conductivity type, a fourth semiconductor layer of the first conductivity type, a second conductive member, and a second insulating part, the third semiconductor layer being between the second semiconductor layer and the fourth semiconductor layer, the second insulating part being between the second semiconductor layer and the second conductive member, between the third semiconductor layer and the second conductive member, and between the fourth semiconductor layer and the second conductive member; and bonding the first semiconductor layer and the fourth semiconductor layer.

Configuration 20

The method for manufacturing the semiconductor device according to Configuration 19, the method further comprising:

before the bonding, causing at least one of a first surface of the first conductive member or a second surface of the second conductive member to be concave, the bonding including causing the second surface to face the first surface.

Configuration 21

A method for manufacturing a semiconductor device, the method comprising:

preparing a first structure body, the first structure body including a first semiconductor layer of a first conductivity type, a first conductive member, and a first insulating part provided between the first semiconductor layer and the first conductive member;

bonding a semiconductor member to the first structure body; and forming a second semiconductor layer of the first conductivity type, a third semiconductor layer of a second conductivity type, a second conductive member, and a second insulating part, at least the second semiconductor layer and the third semiconductor layer being formed from the semiconductor member, the third semiconductor layer being between the second semiconductor layer and the first structure body, the second insulating part being between the second semiconductor layer and the second conductive member and between the third semiconductor layer and the second conductive member.

Configuration 22

A method for manufacturing a semiconductor device, the method comprising:

preparing a first structure body, the first structure body including a first semiconductor layer of a first conductivity type, a plurality of first conductive members, and a first insulating part provided between the first semiconductor layer and the plurality of first conductive members, the first semiconductor layer including a region between the plurality of first conductive members;

forming a semiconductor member on the region between the plurality of first conductive members; and forming a second semiconductor layer of the first conductivity type, a third semiconductor layer of a second conductivity type, a second conductive member, and a second insulating part, at least the second semiconductor layer and the third semiconductor layer being formed from the semiconductor member, the third semiconductor layer being between the second semiconductor layer and the first structure body, the second insulating part being between the second semiconductor layer and the second conductive member and between the third semiconductor layer and the second conductive member.

According to the embodiments, a semiconductor device and a method for manufacturing the semiconductor device can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as conductive members, semiconductor regions, semiconductor layers, insulating parts, electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing semiconductor devices practicable by an appropriate design modification by one skilled in the art based on the semiconductor devices, and the methods for manufacturing semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first conductive member;
a second conductive member, a direction from the first conductive member toward the second conductive member being along a first direction;
a first semiconductor region of a first conductivity type, the first semiconductor region including a first partial region and a second partial region, a second direction from the first partial region toward the second partial region crossing the first direction, the first conductive member being between the first partial region and the second conductive member in the first direction;
a second semiconductor region of the first conductivity type, a direction from the second partial region toward the second semiconductor region being along the first direction, a direction from a portion of the second conductive member toward the second semiconductor region being along the second direction;
a third semiconductor region of a second conductivity type, the third semiconductor region being between the second partial region and the second semiconductor region in the first direction, a direction from an other portion of the second conductive member toward the third semiconductor region being along the second direction; and
an insulating part including
a first insulating region provided between the first partial region and the first conductive member in the first direction,
a second insulating region provided between the second semiconductor region and the portion of the second conductive member in the second direction, and
a third insulating region provided between the third semiconductor region and the other portion of the second conductive member in the second direction,
a void being between the first conductive member and the second conductive member.

2. The semiconductor device according to claim 1, wherein
the first conductive member includes a first surface facing the second conductive member, and
the first surface is concave.

3. The semiconductor device according to claim 1, wherein
the second conductive member includes a second surface facing the first conductive member, and
the second surface is concave.

4. The semiconductor device according to claim 1, wherein
the insulating part further includes a fourth insulating region, and
the fourth insulating region is provided between at least a portion of the first conductive member and at least a portion of the second conductive member in the first direction.

5. The semiconductor device according to claim 1, wherein
a crystal orientation of the first conductive member is different from a crystal orientation of the second conductive member.

6. The semiconductor device according to claim 1, further comprising:
a conductive region,
at least a portion of the second semiconductor region being between the conductive region and the portion of the second conductive member in the second direction,
the conductive region being a semiconductor region,
a concentration of an impurity of the second conductivity type in the conductive region being greater than a concentration of the impurity of the second conductivity type in the third semiconductor region.

7. The semiconductor device according to claim 6, wherein
the conductive region contacts the third semiconductor region.

8. The semiconductor device according to claim 1, further comprising:
a first electrode and a second electrode,
the first partial region being between the first electrode and the first conductive member in the first direction,
the first electrode being electrically connected to the first semiconductor region,
the second electrode being electrically connected to the second semiconductor region.

9. The semiconductor device according to claim 8, further comprising:
a fifth semiconductor region of the first conductivity type,
at least a portion of the fifth semiconductor region being between the first electrode and the first semiconductor region in the first direction,
a concentration of an impurity of the first conductivity type in the fifth semiconductor region being greater than a concentration of the impurity of the first conductivity type in the first semiconductor region.

10. A semiconductor device, comprising:
a first conductive member;
a second conductive member, a direction from the first conductive member toward the second conductive member being along a first direction;
a first semiconductor region of a first conductivity type, the first semiconductor region including a first partial region and a second partial region, a second direction from the first partial region toward the second partial region crossing the first direction, the first conductive member being between the first partial region and the second conductive member in the first direction;
a second semiconductor region of the first conductivity type, a direction from the second partial region toward the second semiconductor region being along the first direction, a direction from a portion of the second conductive member toward the second semiconductor region being along the second direction;
a third semiconductor region of a second conductivity type, the third semiconductor region being provided between the second partial region and the second semiconductor region in the first direction, a direction from an other portion of the second conductive member toward the third semiconductor region being along the second direction; and
an insulating part including
a first insulating region provided between the first partial region and the first conductive member in the first direction,
a second insulating region provided between the second semiconductor region and the portion of the second conductive member in the second direction, and
a third insulating region provided between the third semiconductor region and the other portion of the second conductive member in the second direction,
the first conductive member including a first surface facing the second conductive member,
the first surface being concave.

11. The semiconductor device according to claim 10, wherein
the second conductive member includes a second surface facing the first conductive member, and
the second surface is concave.

12. A semiconductor device, comprising:
a first conductive member;
a second conductive member, a direction from the first conductive member toward the second conductive member being along a first direction;
a first semiconductor region of a first conductivity type, the first semiconductor region including a first partial region, a second partial region, a third partial region, a fourth partial region, and a fifth partial region, a second direction from the third partial region toward the second partial region crossing the first direction, the first partial region being between the third partial region and the second partial region in the second direction, the first conductive member being between the first partial region and the second conductive member in the first direction, the first conductive member being between the fourth partial region and the fifth partial region in the second direction;

a second semiconductor region of the first conductivity type, the second semiconductor region including a first semiconductor portion and a second semiconductor portion, a direction from the second semiconductor portion toward the first semiconductor portion being along the second direction, the fourth partial region being between the third partial region and the first semiconductor portion in the first direction, the fifth partial region being between the second partial region and the second semiconductor portion in the first direction, a portion of the second conductive member being between the first semiconductor portion and the second semiconductor portion;

a third semiconductor region of a second conductivity type, the third semiconductor region including a third semiconductor portion and a fourth semiconductor portion, the third semiconductor portion being between the fourth partial region and the first semiconductor portion in the first direction, the fourth semiconductor portion being between the fifth partial region and the second semiconductor portion in the first direction, an other portion of the second conductive member being between the third semiconductor portion and the fourth semiconductor portion in the second direction; and an insulating part including
  a first insulating region provided between the first partial region and the first conductive member in the first direction,
  a second insulating region provided between the third semiconductor portion and the other portion of the second conductive member in the second direction,
  a third insulating region provided between the fourth semiconductor portion and the other portion of the second conductive member in the second direction,
  a fourth insulating region provided between the fourth partial region and the first conductive member in the second direction, and
  a fifth insulating region provided between the first conductive member and the fifth partial region in the second direction, the fourth insulating region including a first side surface facing the fourth partial region,
the fifth insulating region including a second side surface facing the fifth partial region,
the second insulating region including a third side surface facing the third semiconductor portion,
the third insulating region including a fourth side surface facing the fourth semiconductor portion,
a first distance along the second direction between the first side surface and the second side surface being greater than a second distance along the second direction between the third side surface and the fourth side surface.

13. The semiconductor device according to claim 12, wherein
a length along the second direction of the first conductive member is greater than a length along the second direction of the second conductive member.

14. A semiconductor device, comprising:
a first conductive member;
a second conductive member, a direction from the first conductive member toward the second conductive member being along a first direction;
a third conductive member, the third conductive member including a first conductive portion and a second conductive portion, the first conductive portion being provided between the first conductive member and the second conductive member;
a first semiconductor region of a first conductivity type, the first semiconductor region including a first partial region, a second partial region, a third partial region, and a fourth partial region, a second direction from the first partial region toward the second partial region crossing the first direction, the first conductive member being between the first partial region and the second conductive member in the first direction;
a second semiconductor region of the first conductivity type, a direction from the second partial region toward the second semiconductor region being along the first direction, a direction from a portion of the second conductive member toward the second semiconductor region being along the second direction, the third partial region being between the second partial region and the second semiconductor region in the first direction, the second conductive portion being between the third partial region and the second semiconductor region in the first direction;
a third semiconductor region of a second conductivity type, the third semiconductor region being provided between the second conductive portion and the second semiconductor region in the first direction, a direction from an other portion of the second conductive member toward the third semiconductor region being along the second direction;
a fourth semiconductor region of the first conductivity type, the fourth semiconductor region being between the second conductive portion and the third semiconductor region in the first direction; and
an insulating part including
  a first insulating region provided between the first conductive member and the first conductive portion, and
  a second insulating region provided between the first conductive portion and the second conductive member.

15. The semiconductor device according to claim 14, wherein
the second conductive portion contacts the third partial region and contacts the fourth semiconductor region.

16. A semiconductor device, comprising:
a first conductive member;
a second conductive member, a direction from the first conductive member toward the second conductive member being along a first direction;
a first semiconductor region of a first conductivity type, the first semiconductor region including a first partial region and a second partial region, a second direction from the first partial region toward the second partial region crossing the first direction, the first conductive member being between the first partial region and the second conductive member in the first direction;
a second semiconductor region of the first conductivity type, a direction from the second partial region toward the second semiconductor region being along the first direction, a direction from a portion of the second conductive member toward the second semiconductor region being along the second direction;

a third semiconductor region of a second conductivity type, the third semiconductor region being between the second partial region and the second semiconductor region in the first direction, a direction from an other portion of the second conductive member toward the third semiconductor region being along the second direction; and an insulating part including
- a first insulating region provided between the first partial region and the first conductive member in the first direction,
- a second insulating region provided between the second semiconductor region and the portion of the second conductive member in the second direction, and
- a third insulating region provided between the third semiconductor region and the other portion of the second conductive member in the second direction, a crystal orientation of the first conductive member being different from a crystal orientation of the second conductive member.

17. A method for manufacturing a semiconductor device, the method comprising:

preparing a first structure body and a second structure body,
- the first structure body including a first semiconductor layer of a first conductivity type, a first conductive member, and a first insulating part provided between the first semiconductor layer and the first conductive member,
- the second structure body including a second semiconductor layer of the first conductivity type, a third semiconductor layer of a second conductivity type, a fourth semiconductor layer of the first conductivity type, a second conductive member, and a second insulating part,
- the third semiconductor layer being between the second semiconductor layer and the fourth semiconductor layer,
- the second insulating part being between the second semiconductor layer and the second conductive member, between the third semiconductor layer and the second conductive member, and between the fourth semiconductor layer and the second conductive member; and bonding the first semiconductor layer and the fourth semiconductor layer.

18. The method for manufacturing the semiconductor device according to claim 17, the method further comprising:

before the bonding, causing at least one of a first surface of the first conductive member or a second surface of the second conductive member to be concave, the bonding including causing the second surface to face the first surface.

* * * * *